(12) United States Patent
Tobita

(10) Patent No.: US 7,492,853 B2
(45) Date of Patent: Feb. 17, 2009

(54) SHIFT REGISTER AND IMAGE DISPLAY APPARATUS CONTAINING THE SAME

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 47 days.

(21) Appl. No.: 11/625,117

(22) Filed: Jan. 19, 2007

(65) Prior Publication Data

US 2007/0217564 A1 Sep. 20, 2007

(30) Foreign Application Priority Data

Mar. 15, 2006 (JP) .............................. 2006-070244

(51) Int. Cl.
*G11C 19/00* (2006.01)
(52) U.S. Cl. .......................................... 377/64; 377/67
(58) Field of Classification Search ....................... None
See application file for complete search history.

(56) References Cited

U.S. PATENT DOCUMENTS

| 5,517,543 | A | * | 5/1996 | Schleupen et al. | ............ | 377/79 |
| 6,064,713 | A | * | 5/2000 | Lebrun et al. | ................. | 377/67 |
| 7,120,221 | B2 | * | 10/2006 | Moon | ........................ | 377/64 |
| 7,289,593 | B2 | * | 10/2007 | Tobita et al. | ................... | 377/64 |
| 7,289,594 | B2 | * | 10/2007 | Moon | ......................... | 377/68 |
| 7,317,780 | B2 | * | 1/2008 | Lin et al. | ...................... | 377/67 |
| 7,342,568 | B2 | * | 3/2008 | Wei et al. | ................... | 345/100 |
| 2006/0139292 | A1 | | 6/2006 | Yoon et al. | | |
| 2006/0290390 | A1 | | 12/2006 | Jang et al. | | |
| 2007/0217564 | A1 | | 9/2007 | Tobita | | |

FOREIGN PATENT DOCUMENTS

JP 2001-350438 12/2001
JP 2004-246358 9/2004

OTHER PUBLICATIONS

Soon Young Yoon, et al., "P-172L: Late-News Poster: Highly Stable Integrated Gate Driver Circuit Using a-Si TFT with Dual Pull-down Structure", SID 05 Digest, pp. 348-351, 2005.
U.S. Appl. No. 11/937,791, filed Nov. 9, 2007, Tobita.
U.S. Appl. No. 11/614,384, filed Dec. 21, 2006, Tobita.
U.S. Appl. No. 11/625,117, filed Jan. 19, 2007, Tobita.
U.S. Appl. No. 11/670,133, filed Feb. 1, 2007, Tobita, et al.
U.S. Appl. No. 11/676,866, filed Feb. 20, 2007, Tobita.
U.S. Appl. No. 11/838,416, filed Aug. 14, 2007, Tobita, et al.
U.S. Appl. No. 11/831,131, filed Jul. 31, 2007, Tobita.

* cited by examiner

*Primary Examiner*—Cassandra Cox
(74) *Attorney, Agent, or Firm*—Oblon, Spivak, McClelland, Maier & Neustadt, P.C.

(57) ABSTRACT

A unit shift register includes first and second transistors for supplying low supply voltage to an output terminal. First and second control signals which are complementary to each other are input to first and second control terminals, respectively. A third transistor is connected between the first transistor and first control terminal, and a fourth transistor is connected between the second transistor and second control terminal. The third and fourth transistors each have its drain connected to the gate of each other in a crossed manner.

16 Claims, 20 Drawing Sheets

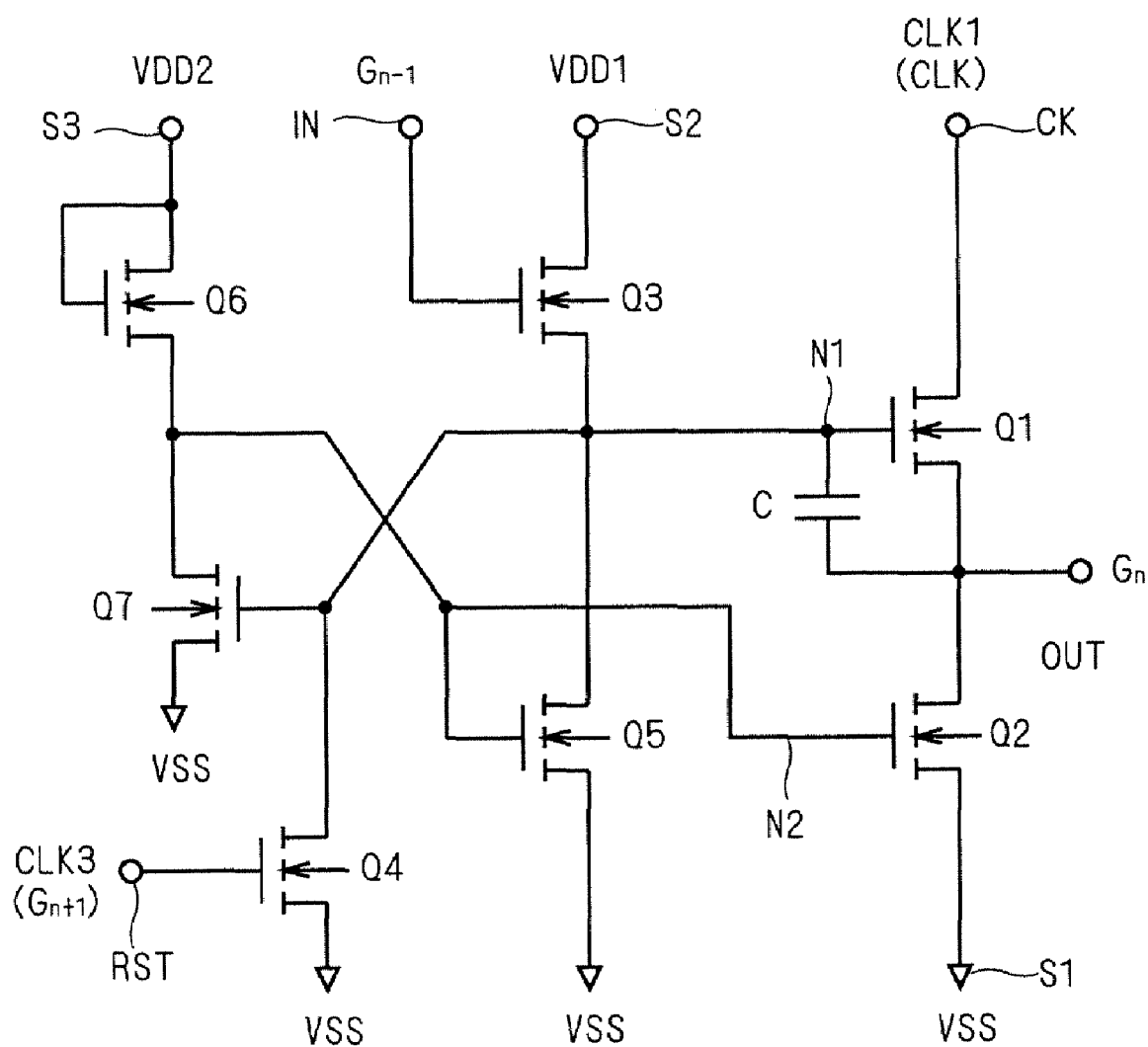
F I G . 3

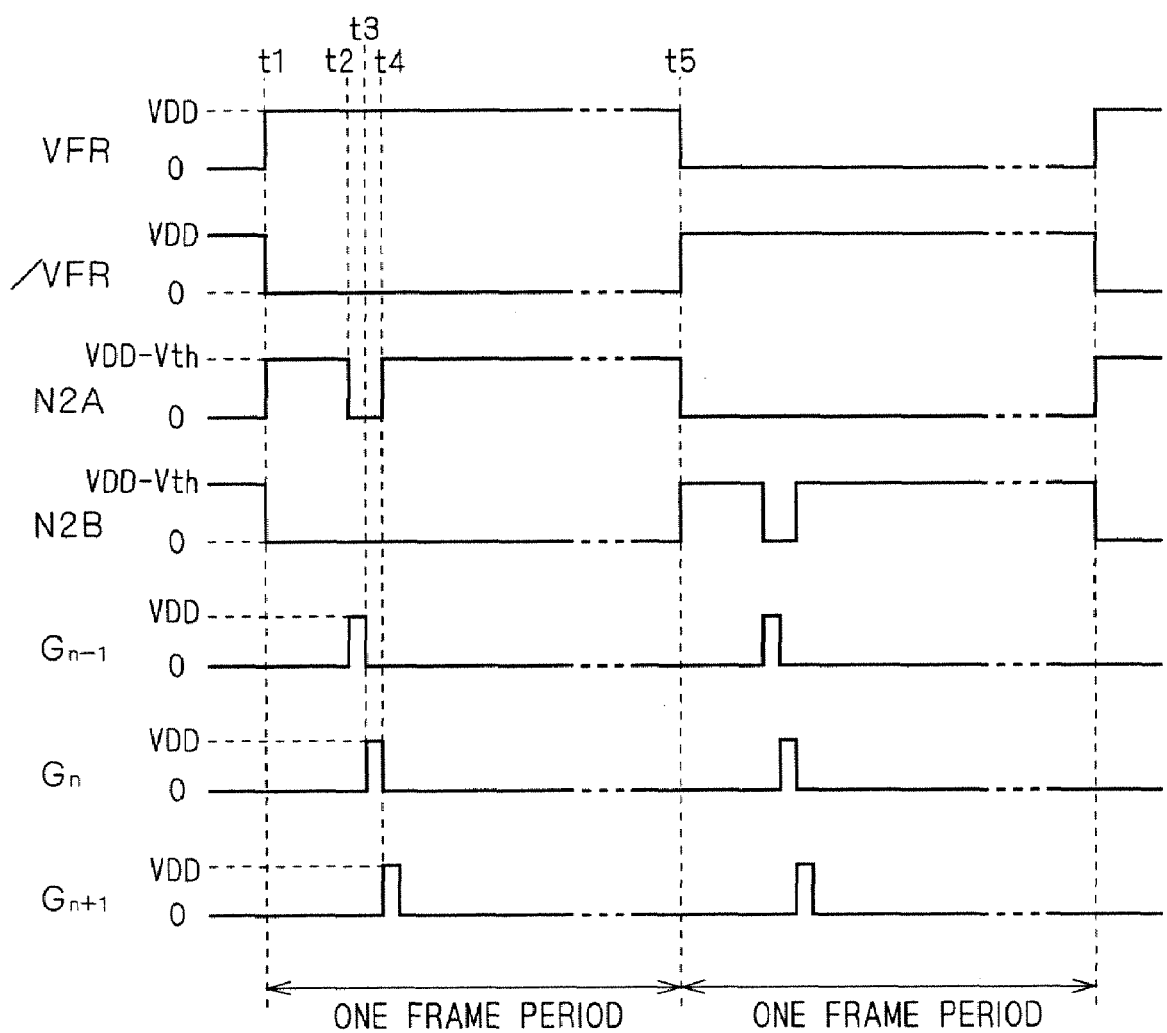

F I G . 1 9
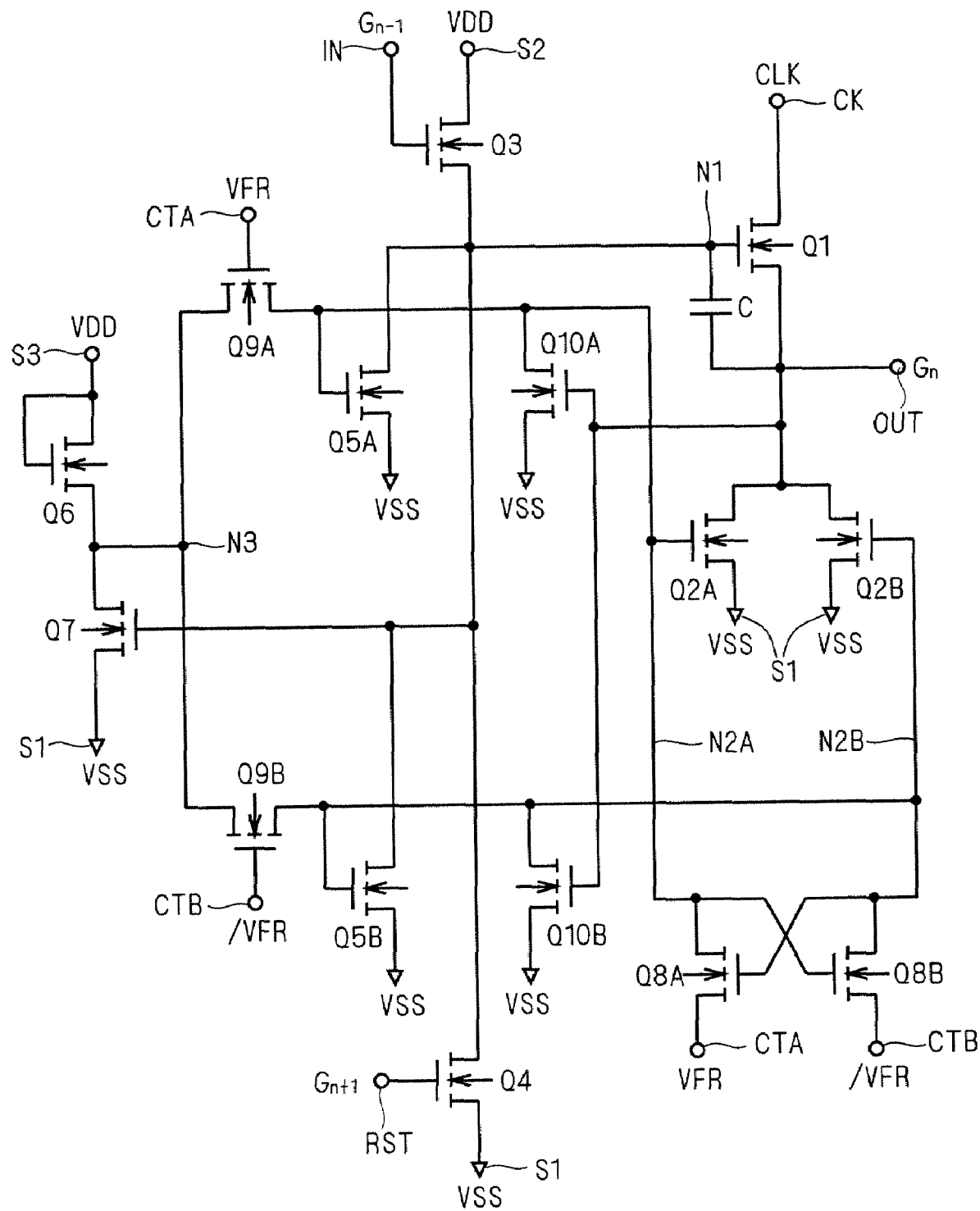

SHIFT REGISTER AND IMAGE DISPLAY APPARATUS CONTAINING THE SAME

BACKGROUND OF THE INVENTION

1. Field of the Invention

The present invention relates to a shift register, and more particularly, to a shift register for use as a scanning-line driving circuit for an image display apparatus or the like, which is formed of field effect transistors of the same conductivity type only.

2. Description of the Background Art

An image display apparatus (hereinafter referred to as a "display apparatus") such as a liquid crystal display includes a display panel in which a plurality of pixels are arrayed in a matrix. A gate line (scanning line) is provided for each row of pixels (pixel line), and gate lines are sequentially selected and driven in a cycle of one horizontal period of a display signal, so that a displayed image is updated. As a gate-line driving circuit (scanning-line driving circuit) for sequentially selecting and driving pixel lines, i.e., gate lines, a shift register for performing a shift operation in one frame period of a display signal can be used.

To reduce the number of steps in the manufacturing process of a display apparatus, such shift register used as the gate-line driving circuit is preferably formed of field effect transistors of the same conductivity type only. Accordingly, various types of shift registers formed of N- or P-type field effect transistors only and display apparatuses containing such shift registers have been proposed (e.g., "Highly Stable Integrated Gate Driver Circuit using a-Si TFT with Dual Pull-down Structure" Soon Young Yoon, et al., SIC 05 DIGEST, pp. 348-351). As a field effect transistor, a metal oxide semiconductor (MOS) transistor, a thin film transistor (TFT), or the like is used.

A shift register used for the gate-line driving circuit is formed of a plurality of shift registers provided for each pixel line, i.e., each gate line connected in cascade (cascade-connected). For ease of description, each of a plurality of shift registers constituting the gate-line driving circuit will be called "a unit shift register" throughout the present specification.

A typical unit shift register includes, in the output stage, an output pull-up transistor connected between an output terminal and a clock terminal and an output pull-down transistor connected between the output terminal and a reference voltage terminal. In such unit shift register, a clock signal input to the clock terminal with the output pull-up transistor turned on and the output pull-down transistor turned off by a predetermined input signal is transmitted to the output terminal, so that an output signal is output. In contrast, the output pull-up transistor is turned off and the output pull-down transistor is turned on during a period in which the input signal is not input, so that the voltage level (hereinafter briefly called "level") at the output terminal is maintained at the L level.

A display apparatus employing amorphous silicon TFTs (a-Si TFTs) as shift registers of a gate-line driving circuit easily achieves large-area display with great productivity, and is widely used as the screen of a notebook PC, a large-screen display apparatus, etc.

Conversely, an a-Si TFT tends to have its threshold voltage shifted in the positive direction when the gate electrode is continuously positively biased (dc-biased), resulting in degraded driving capability (current-flowing capability). Particularly in a shift register of a gate-line driving circuit, an operation in which the gate of the output pull-down transistor is positively biased for about one frame period (about 16 ms) is continuously carried out, which gradually degrades the output pull-down transistor in driving capability. Then, the output pull-down transistor cannot discharge unnecessary charges when supplied to the output terminal due to noise or the like, resulting in a malfunction of erroneous activation of gate lines.

To solve the problem, the aforementioned paper by S. Y. Yoon, et al. presents a gate driver circuit in which dual output pull-down transistors are provided in parallel for an output terminal of a unit shift register and are alternately activated/deactivated by each frame so that the gate electrode of one of the output pull-down transistors is not continuously biased.

However, such dual output pull-down transistors provided for a unit shift register requires dual circuits (pull-down driving circuits) for driving the dual pull-down transistors to be provided in the unit shift register, which raises a concern about resultant increased consumption power.

SUMMARY OF THE INVENTION

An object of the present invention is to prevent malfunctions of shift registers while suppressing increase in consumption power to achieve improved driving capability.

According to the present invention, the shift register includes a clock terminal and an output terminal, a first transistor configured to supply a clock signal input to the clock terminal to the output terminal, and second and third transistors both configured to discharge the output terminal. The first, second and third transistors have their control electrodes connected to first, second and third nodes, respectively. The shift register further includes a fourth transistor connected between a first control terminal to which a predetermined first control signal is input and the second node, a fifth transistor connected between a second control terminal to which a predetermined second control signal is input and the third node, and a driving circuit configured to alternately drive the second and third transistors on the basis of the first and second control signals. The fourth and fifth transistors each have one main electrode connected to a control electrode of each other in a crossed manner.

When the driving circuit alternately drives the second and third transistors on the basis of the first and second control signals, the fifth and sixth transistors are also alternately turned on/off. The control electrode of a deactivated one of the second and third transistors is thereby fixed to a predetermined level. This can prevent the threshold voltages of the second and third transistors from being shifted, which achieves improved operational reliability. Further, since the fifth and sixth transistors are connected to the first and second transistors, respectively, they are turned on/off with reduced power, which suppresses increase in consumption power.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram illustrating the configuration of a conventional unit shift register;

FIG. 8 is a timing chart illustrating the operation of the unit shift register according to the first preferred embodiment;

FIGS. 19 and 20 are circuit diagrams each illustrating the configuration of a unit shift register according to an eighth preferred embodiment of the invention.

DESCRIPTION OF THE PREFERRED EMBODIMENTS

Figure 1:
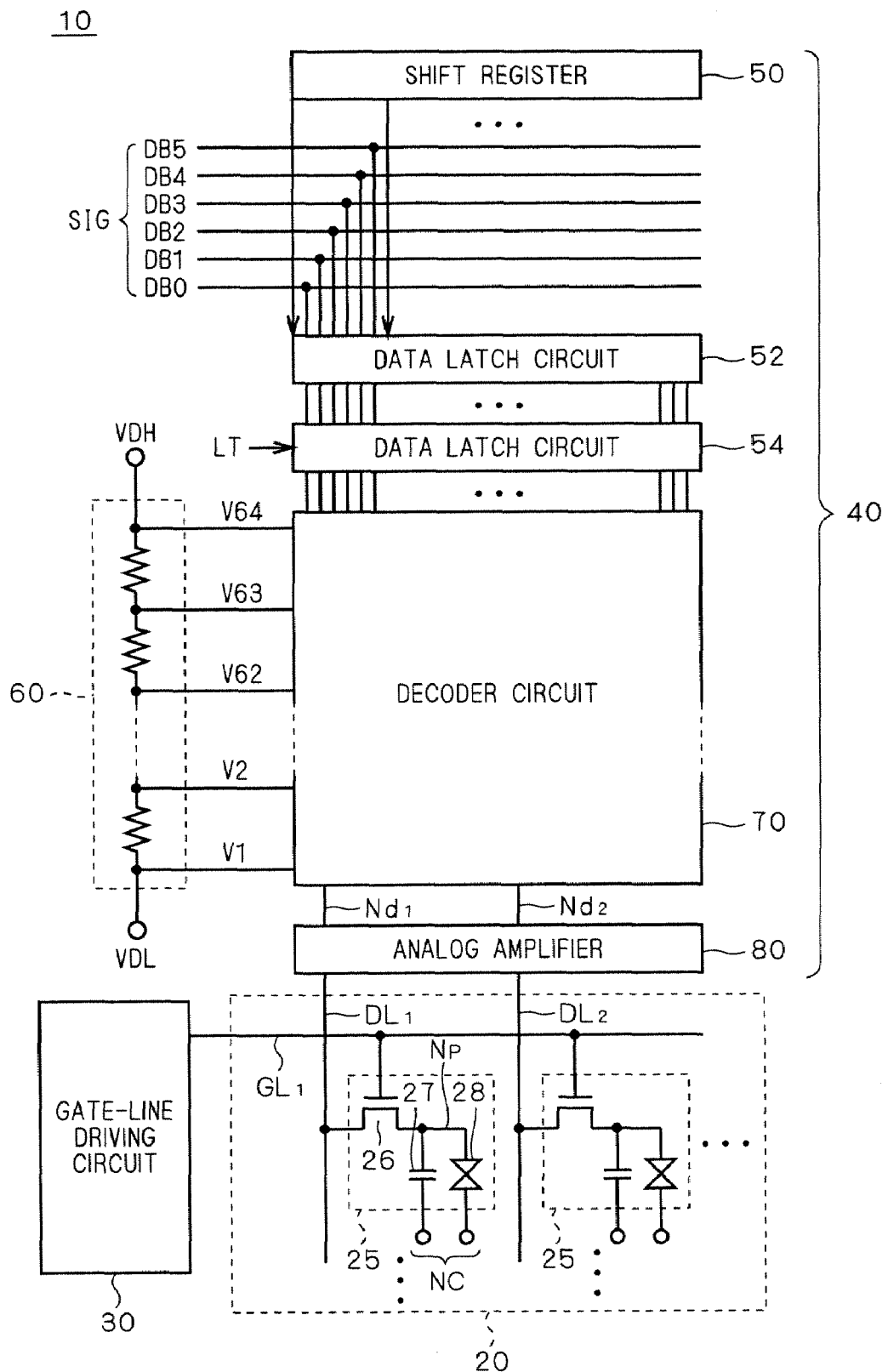
FIG. 1 is a schematic block diagram illustrating the configuration of a display apparatus according to the present invention.

Preferred embodiments of the present invention will be described hereinbelow referring to the accompanied drawings. To avoid repeated and redundant description, elements having the same or corresponding functions are indicated by the same reference characters in the drawings.

First Preferred Embodiment

FIG. 1 is a schematic block diagram illustrating the configuration of a display apparatus according to the present invention. The overall configuration of a liquid crystal display 10 is shown as an representative example of the display apparatus.

The liquid crystal display 10 is provided with a liquid crystal array part 20, a gate-line driving circuit (scanning-line driving circuit) 30 and a source driver 40. As will be described later explicitly, a shift register according to the present embodiment is mounted on the gate-line driving circuit 30.

The liquid crystal array part 20 includes a plurality of pixels 25 arrayed in a matrix. The columns of pixels (hereinafter also referred to as "pixel lines") are respectively provided with gate lines $GL_1$, $GL_2$, . . . (hereinafter also generically referred to as a "gate line GL"), and the rows of pixels (hereinafter also referred to as "pixel rows") are respectively provided with data lines $DL_1$, $DL_2$, . . . (hereinafter generically referred to as a "data line DL"). FIG. 1 representatively shows pixels 25 of the first and second rows in the first column and corresponding gate line $GL_1$ and data lines $DL_1$ and $DL_2$.

Each pixel 25 has a pixel switching device 26 disposed between a corresponding data line DL and a pixel node Np, and a capacitor 27 and a liquid crystal display device 28 connected in parallel between the pixel node Np and a common electrode node NC. The crystal orientation in the liquid crystal display device 28 changes depending on the voltage difference between the pixel node Np and common electrode node NC, and in response to this change, the display luminance of the liquid crystal display device 28 changes. Accordingly, the luminance of each pixel 25 can be controlled by a display voltage transmitted to the pixel node Np via the data line DL and pixel switching device 26. In other words, an intermediate voltage difference between a voltage difference corresponding to the maximum luminance and a voltage difference corresponding to the minimum luminance is applied between the pixel node Np and common electrode node NC, whereby halftone luminance can be obtained. Therefore, setting display voltages stepwise, grayscale luminance can be obtained.

The gate-line driving circuit 30 sequentially selects and drives a gate line GL in a predetermined scanning cycle. Each pixel switching device 26 has its gate electrode connected to a corresponding gate line GL. While a certain gate line GL is selected, the pixel switching device 26 is brought into the conducting state in each pixel 25 connected to the selected gate line GL, whereby the pixel node Np is connected to a corresponding data line DL. Then, the display voltage transmitted to the pixel node Np is held by the capacitor 27. Generally, the pixel switching device 26 is constructed from a TFT formed on a substrate of the same insulator as the liquid crystal display device 28 (a glass substrate, a resin substrate or the like).

The source driver 40 is provided to output display voltages set stepwise by a display signal SIG which is an N-bit digital signal, to the data lines DL. As an example, the display signal SIG is assumed to be a 6-bit signal including display signal bits DB0 to DB5. With such 6-bit display signal SIG, $2^6=64$ levels of gray can be displayed in each pixel 25. Further, a display of approximately 260 thousand colors can be achieved by forming one color display unit by three pixels of R (Red), G (Green) and B (Blue).

As shown in FIG. 1, the source driver 40 includes a shift register 50, data latch circuits 52, 54, a gradation voltage generating circuit 60, a decoder circuit 70 and an analog amplifier 80.

In the display signal SIG, the display signal bits DB0 to DB5 corresponding to the display luminance of respective pixels 25 are serially generated. In other words, each of the display signal bits DB0 to DB5 with each timing indicates the display luminance of any one pixel 25 in the liquid crystal array part 20.

The shift register 50 gives an instruction to the data latch circuit 52 to capture the display signal bits DB0 to DB5 in synchronization with a cycle during which the settings of the display signal SIG are changed. The data latch circuit 52 sequentially captures serially-generated display signals SIG to latch display signals SIG for one pixel line.

A latch signal LT input to the data latch circuit 54 is activated with timing when display signals SIG for one pixel line are captured by the data latch circuit 52. In response to this, the data latch circuit 54 captures the display signals SIG for one pixel line latched by the data latch circuit 52 at that time.

The gradation voltage generating circuit 60 is formed by 63 resistor dividers connected in series between a high voltage VDH and a low voltage VDL, for generating 64 levels of gradation voltages V1 to V64, respectively.

The decoder circuit 70 decodes display signals SIG latched by the data latch circuit 54, and based on the result of decoding, selects voltages to be respectively output to decoder output nodes Nd1, Nd2, . . . (generically referred to as a "decoder output node Nd") from among the gradation voltages V1 to V64, and outputs the selected voltages.

As a result, display voltages (selected from among the gradation voltages V1 to V64) corresponding to the display signals SIG for one pixel line latched by the data latch circuit 54 are output to the decoder output node Nd at the same time (in parallel). FIG. 1 representatively shows the decoder output nodes Nd1 and Nd2 corresponding to the data line $DL_1$ of the first row and the data line $DL_2$ of the second row, respectively.

The analog amplifier 80 outputs analog voltages corresponding to display voltages output from the decoder circuit 70 to the decoder output nodes Nd1, Nd2, . . . , to the data lines $DL_1$, $DL_2$, . . . , respectively.

The source driver 40 repeatedly outputs display voltages corresponding to a series of display signals SIG for one pixel line to the data line DL in a predetermined scanning cycle, and the gate-line driving circuit 30 sequentially drives the gate lines $GL_1$, $GL_2$, . . . in synchronization with the scanning cycle. Accordingly, image display based on the display signals SIG is provided on the liquid crystal array part 20.

FIG. 1 shows an example of the liquid crystal display 10 with the gate-line driving circuit 30 and source driver 40 formed integrally with the liquid crystal array part 20, however, the gate-line driving circuit 30 and source driver 40 may be provided as an external circuit of the liquid crystal array part 20.

Figure 2:
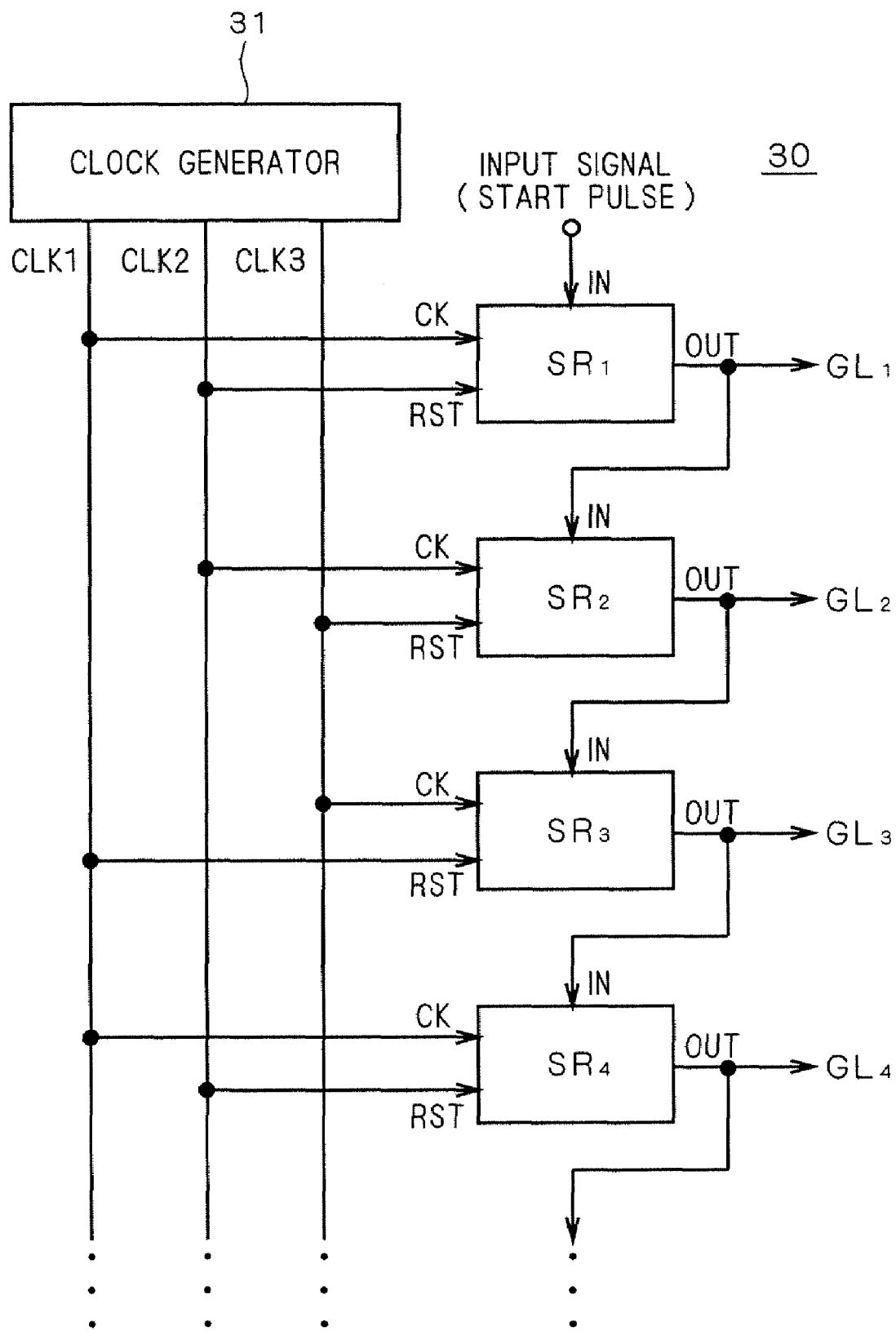
FIG. 2 is a block diagram illustrating an exemplary configuration of a gate-line driving circuit employing unit shift registers according to the invention.

FIG. 2 shows the configuration of the gate-line driving circuit 30. The gate-line driving circuit 30 includes a plurality of unit shift registers $SR_1$, $SR_2$, $SR_3$, $SR_4$, . . . connected in cascade (hereinafter, the unit shift registers $SR_1$, $SR_2$, . . . will generically be called a "unit shift register SR"). The unit shift register SR is provided one each for one pixel line, i.e., one gate line GL.

A clock generator 31 shown in FIG. 2 is provided to input three phase clock signals CLK1, CLK2 and CLK3, shifted in phase with each other, to the unit shift register SR of the gate-line driving circuit 30. These clock signals CLK1, CLK2 and CLK3 are controlled to be sequentially activated with timing synchronized with the scanning cycle of the display apparatus.

Each unit shift register SR includes an input terminal IN, an output terminal OUT, a clock terminal CK and a reset terminal RST. As shown in FIG. 2, either one of the clock signals CLK1, CLK2 and CLK3 output from the clock generator 31 is supplied to the clock terminal CK and reset terminal RST of each unit shift register SR, respectively. The unit shift register SR has its output terminal OUT connected to a gate line GL. That is, a signal output to the output terminal OUT (output signal) is a horizontal (or vertical) scanning pulse for activating the gate line GL.

A start pulse corresponding to the head of each frame period of an image signal is input to the input terminal IN of the unit shift register $SR_1$ of the first stage. To the input terminal IN of each of the unit shift registers SR of the second and following stages, an output signal from the immediately preceding stage is input. In other words, the input terminal IN of the unit shift register SR of the second or subsequent stage is connected to the output terminal OUT of the unit shift register SR of the immediately preceding stage.

In the gate-line driving circuit 30 of such configuration, each unit shift register SR transmits an input signal received from the immediately preceding stage (output signal from the immediately preceding stage) to a corresponding gate line GL and to a unit shift register SR of the immediately succeeding stage while shifting the input signal in synchronization with the clock signals CLK1, CLK2 and CLK3 (operation of the unit shift register SR will be described later in detail). As a result, a series of unit shift registers SR serve as what is called a gate-line driving unit for sequentially activating gate lines GL with timing based on the predetermined scanning cycle.

For ease of description of the present invention, a conventional unit shift register will now be described. FIG. 3 is a circuit diagram illustrating the configuration of the conventional unit shift register SR. In the gate-line driving circuit 30, the respective unit shift registers SR connected in cascade have substantially the same configuration. Therefore, the configuration of one unit shift register SR will be described below as a representative example. Transistors constituting the unit shift register SR are all field-effect transistors of the same conductivity type, and are all assumed to be N-type TFTs in the present embodiment.

As shown in FIG. 3, the conventional unit shift register SR includes a first power terminal S1 to which a low supply voltage VSS is supplied, and second and third power terminals S2 and S3 to which a high supply voltage VDD is supplied, respectively, in addition to the input terminal IN, output terminal OUT, clock terminal CK and reset terminal RST already shown in FIG. 2. While the same potential (VDD) is supplied to both the second and third power terminals S2 and S3 in this example, different potentials may be supplied only if those potentials are sufficient for driving the transistors Q1 and Q2, respectively. In the following description, the low supply voltage VSS will be defined as a reference potential of the circuit (=0V); in practical use, however, a reference potential is determined with reference to a voltage of data written in pixels. For example, the high supply voltage VDD may be set at 17V, and the low supply voltage VSS may be set at −12V.

The output stage of the unit shift register SR includes a transistor Q1 connected between the output terminal OUT and clock terminal CK and a transistor Q2 connected between the output terminal OUT and first power terminal S1. In other words, the transistor Q1 is an output pull-up transistor for supplying the clock signal input to the clock terminal CK to the output terminal OUT, and the transistor Q2 is an output pull-down transistor for supplying the level at the first power terminal S1 to the output terminal OUT. Hereinafter, a node to which the gate (control electrode) of the transistor Q1 constituting the output stage of the unit shift register SR is connected will be defined as a node N1 (first node), and a node to which the gate (control electrode) of the transistor Q2 is connected will be defined as a node N2 (second node).

A capacitive element C is provided between the gate and source of the transistor Q1 (i.e., between the output terminal OUT and node N1). A transistor Q3 is connected between the node N1 and second power terminal S2, and has its gate connected to the input terminal IN. Transistors Q4 and Q5 are connected between the node N1 and first power terminal S1. The transistor Q4 has its gate connected to the reset terminal RST, and the transistor Q5 has its gate connected to the node N2.

A diode-connected transistor Q6 is connected between the node N2 and third power terminal S3. A transistor Q7 is connected between the node N2 and first power terminal S1, and has its gate connected to the node N1. The transistor Q7 is defined as having a driving capability (current flowing capability) sufficiently higher than that of the transistor Q6. In other words, the transistor Q7 has an on-state resistance lower than that of the transistor Q6. Accordingly, as the gate of the transistor Q7 rises in level, the node N2 drops in level; conversely, as the gate of the transistor Q7 drops in level, the node N2 rises in level. That is, the transistors Q6 and Q7 constitute an inverter in which the node N1 serves as an input node and the node N2 serves as an output node. The inverter is called "a ratio inverter" whose operation is defined by the ratio between the on-state resistances of the transistors Q6 and Q7. This inverter serves as a "pull-down driving circuit" which drives the transistor Q2 for pulling down the level at the output terminal OUT.

A specific operation of the unit shift register SR shown in FIG. 3 will now be discussed. Since the respective unit shift registers SR constituting the gate-line driving circuit 30 operate substantially in the same manner, the operation of a unit shift register $SR_n$ of the n-th stage will be discussed as a representative example.

For ease of description, it is assumed that the clock terminal CK of the unit shift register $SR_n$ receives the clock signal CLK1 and the reset terminal RST receives the clock signal CLK3. This case corresponds to, e.g., the unit shift registers $SR_1$ and $SR_4$ shown in FIG. 2. An output signal from the unit shift register $SR_n$ is defined as $G_n$, and an output signal from a unit shift register SR of the immediately preceding (n−1)th stage is defined as $G_{n-1}$. Threshold voltages of transistors constituting the unit shift register SR are all assumed to have the same value, Vth.

In the initial state, it is assumed that the node N1 is at the L (low) level (VSS), and the node N2 is at the H level (VDD-Vth). Hereinafter, this state will be called a "reset state". It is also assumed that the clock terminal CK (clock signal CLK1), reset terminal RST (clock signal CLK3) and input terminal IN (output signal $G_{n-1}$ from the immediately preceding stage) are all at the L level. In this reset state, the transistor Q1 is off (cut-off state) and the transistor Q2 is on (conducting state). Accordingly, the output terminal OUT (output signal $G_n$) is kept at the L level regardless of the level at the clock terminal CK (clock signal CLK1). That is, the gate line $GL_n$ connected to this unit shift register $SR_n$ is in the non-selected state.

Starting from that state, the output signal $G_{n-1}$ from the immediately preceding stage, when raised to the H level, is input to the input terminal IN of the unit shift register SR to turn on the transistor Q3. At this time, the node N2 is at the H level, and thus, the transistor Q5 is also on, however, the node N1 rises in level since the transistor Q3 is defined as having a driving capability sufficiently higher than that of the transistor Q5 and having an on-state resistance sufficiently lower than that of the transistor Q5.

The transistor Q7 thereby starts conducting, causing the node N2 to drop in level. Then, the transistor Q5 increases in resistance, causing the node N1 to rapidly rise in level to sufficiently turn on the transistor Q7. As a result, the node N2 drops to the L level (VSS), the transistor Q5 turns off, and the node N1 rises to the H level (VDD-Vth). In such state where the node N1 is at the H level and the node N2 is at the L level (hereinafter this state will be called a "set state"), the transistor Q1 is on, and the transistor Q2 is off. Thereafter, the output signal $G_{n-1}$ from the immediately preceding stage returns to the L level to turn off the transistor Q3, but the node N1 is brought into a floating state, whereby this set state is further maintained.

In the set state, the transistor Q1 is on and the transistor Q2 is off. Thus, when the clock signal CLK1 input to the clock terminal CK subsequently rises to the H level, the output terminal OUT rises in level. At this time, the node N1 is stepped up by a certain voltage by a coupling through the capacitive element C and gate-channel capacitance of the transistor Q1 (therefore, the node N1 may also be called "a step-up node"). Accordingly, the gate-source voltage of the transistor Q1 is maintained higher than the threshold voltage (Vth) even when the output terminal OUT rises in level, so that the transistor Q1 is maintained at a low impedance. Therefore, the output signal $G_n$ quickly varies in level along with the level at the clock terminal CK. Particularly when the gate-source voltage of the transistor Q1 is sufficiently high, the transistor Q1 operates in the non-saturated region (a non-saturation operation), causing no loss by the threshold voltage, which causes the output terminal OUT to rise to the same level as the clock signal CLK1. Accordingly, the output signal $G_n$ is at the H level only during a period in which the clock signal CLK1 is at the H level, at which time the gate line $GL_n$ is activated to be brought into a selected state. Then, when the clock signal CLK1 returns to the L level, the output signal $G_n$ quickly returns to the L level following that, which causes the gate line $GL_n$ to be discharged to return to a non-selected state.

Thereafter, when the clock signal CLK3 input to the reset terminal RST rises to the H level, the transistor Q4 is turned on to cause the node N1 to drop to the L level. The transistor Q7 accordingly turns off to cause the node N2 to rise to the H level. That is, the unit shift register SR returns to the reset state in which the transistor Q1 is off and the transistor Q2 is on (therefore, the node N2 may also be called a "reset node").

Giving a summary of the above-described operation, the unit shift register SR is in the reset state unless a signal (start pulse or output signal $G_{n-1}$ from the immediately preceding stage) is input to the input terminal IN, and the transistor Q1 is kept off and the second transistor Q2 is kept on, so that the output terminal OUT (gate line $GL_n$) is maintained at the L level (VSS) with low impedance. When a signal is input to the input terminal IN, the unit shift register SR is switched into the set state. Since the transistor Q1 is on and the second transistor Q2 is off in the set state, the output terminal OUT (output signal $G_n$) is at the H level during a period in which the signal input to the clock terminal CK (clock signal CLK1) is at the H level. Thereafter, when a signal (clock signal CLK3) is input to the reset terminal RST, the original reset state is brought about.

Figure 4:
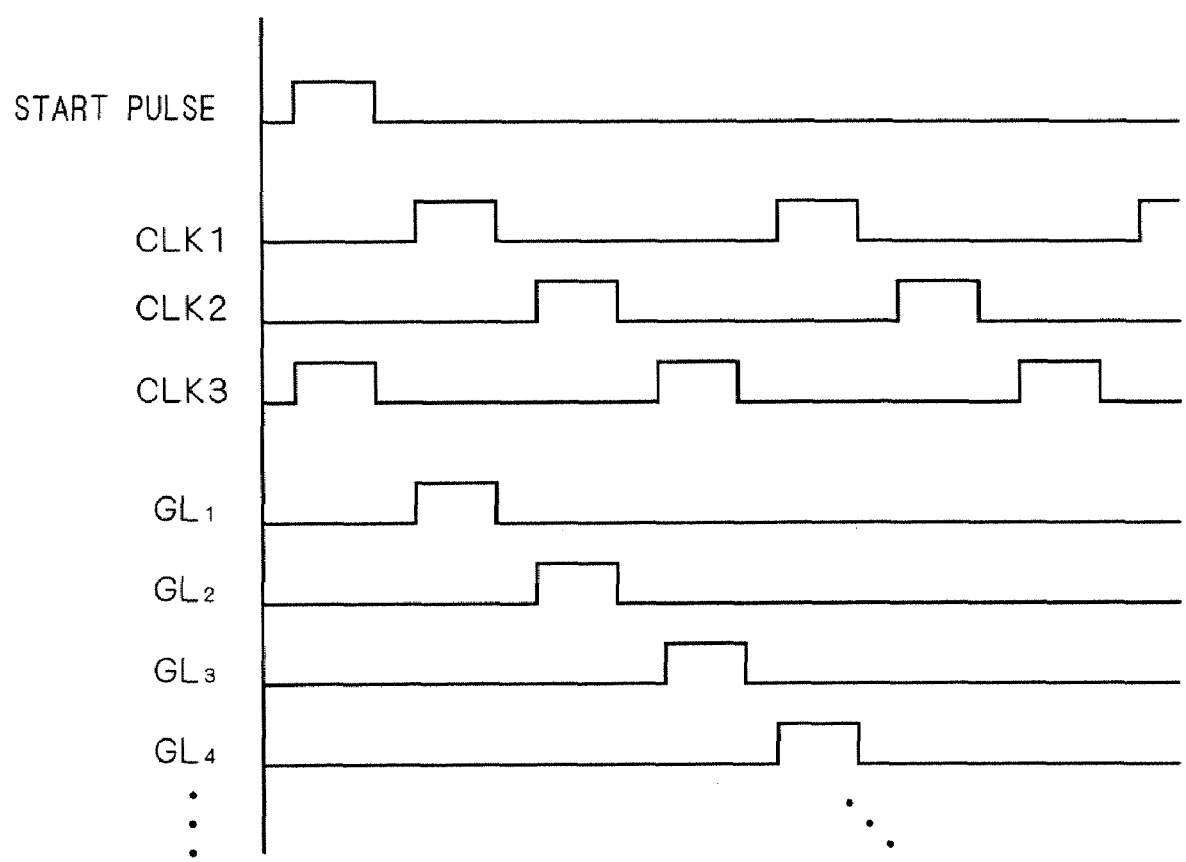
FIG. 4 is a timing chart of an operation of the gate-line driving circuit shown in FIG. 2.

A plurality of unit shift registers SR each operating as described above are connected in cascade as shown in FIG. 2 to constitute the gate-line driving circuit 30. Then, the input signal (start pulse) input to the input terminal IN of the unit shift register SR of the first stage is transmitted to unit shift registers $SR_2$, $SR_3$, . . . in sequence while being shifted with timing synchronized with the clock signals CLK1, CLK2 and CLK3 as shown in the timing chart of FIG. 4. The gate-line driving circuit 30 can thereby drive the gate lines $GL_1$, $GL_2$, $GL_3$, . . . in sequence in a predetermined scanning cycle.

Figure 5:
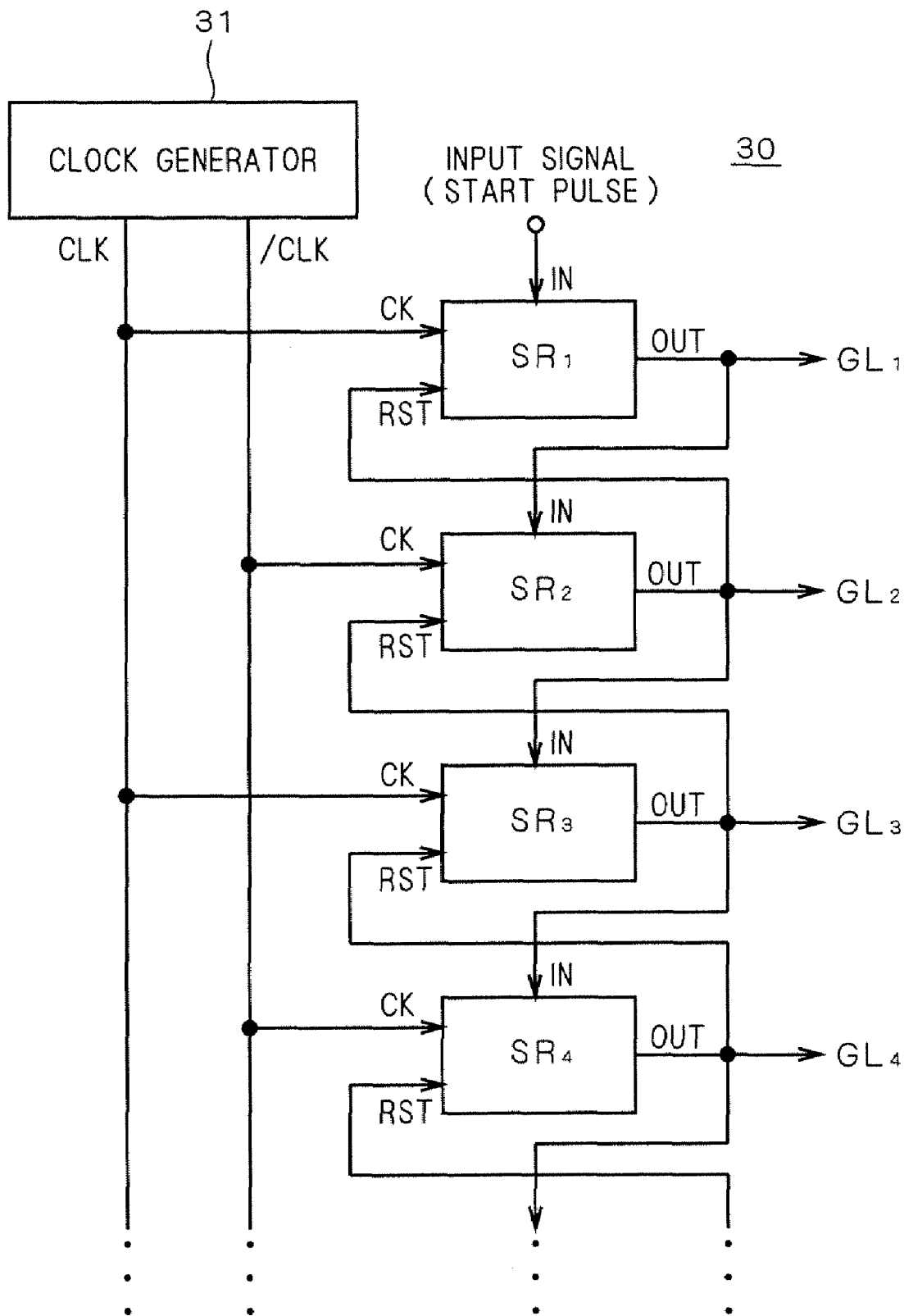
FIG. 5 is a block diagram illustrating another exemplary configuration of a gate-line driving circuit employing unit shift registers according to the invention.

While the above example shows the case in which the plurality of unit shift registers SR operate on the basis of three phase clock signals, two phase clock signals may be used for operation. FIG. 5 illustrates the configuration of the gate-line driving circuit 30 in that case.

In that case, the gate-line driving circuit 30 also includes a plurality of unit shift registers SR connected in cascade. Specifically, each of the unit shift registers SR has its input terminal IN connected to the output terminal OUT of a unit shift register SR of the immediately preceding stage, except that the input terminal IN of the unit shift register $SR_1$ of the first stage receives a start pulse as an input signal.

The clock generator 31 in this case outputs two phase clock signals CLK and /CLK of opposite phases to each other. Either of the clock signals CLK and /CLK is alternately input to the clock terminal CK of each of the unit shift registers SR such that each unit shift register SR and its immediately succeeding unit shift register SR receive clock signals of opposite phases to each other, respectively. As shown in FIG. 5, each of the unit shift registers SR has the reset terminal RST connected to the output terminal OUT of a unit shift register SR of a succeeding stage (in this example, the immediately succeeding stage).

The operation of a unit shift register SR in the gate-line driving circuit 30 configured as shown in FIG. 5 will be described. The operation of the unit shift register $SR_n$ of the n-th stage will also be discussed as a representative example. For ease of description, it is assumed that the clock terminal CK of the unit shift register $SR_n$ receives the clock signal CLK. This case corresponds to, e.g., the unit shift registers $SR_1$ and $SR_3$ shown in FIG. 5. An output signal from the unit shift register $SR_n$ is defined as $G_n$, and output signals from a unit shift register $SR_{n-1}$ of the immediately preceding (n−1)th stage and a unit shift register $SR_{n+1}$ of the immediately succeeding (n+1)th stage are defined as $G_{n-1}$ and $G_{n+1}$, respectively.

In the initial state, the reset state is assumed in which the node N1 is at the L level (VSS) and the node N2 is at the H level (VDD-Vth). It is also assumed that the clock terminal CK (clock signal CLK), reset terminal RST (output signal $G_{n+1}$ from the immediately succeeding stage) and input terminal IN (output signal $G_{n-1}$ from the immediately preceding stage) are all at the L level.

Starting from that state, the output signal $G_{n-1}$ from the immediately preceding stage, when raised to the H level, is input to the input terminal IN of the unit shift register $SR_n$ to turn on the transistor Q3, causing the node N1 to rise in level. The transistor Q7 thereby starts conducting, causing the node N2 to drop in level. Then, the transistor Q5 increases in resistance, causing the node N1 to rapidly rise in level, so that the transistor Q7 sufficiently turns on. The node N2 in turn drops to the L level (VSS) to turn off the transistor Q5, causing the node N1 to rise to the H level (VDD-Vth). As a result, the set state is brought about in which the transistor Q1 is on and the transistor Q2 is off.

Then, when the clock signal CLK rises to the H level to cause the output terminal OUT to rise in level, the node N1 rises in level by a certain voltage by the coupling induced by the capacitive element C and gate-channel capacitance of the transistor Q1. Therefore, the output signal $G_n$ varies in level along with the level at the clock terminal CK. During a period in which the clock signal CLK is at the H level, the output signal $G_n$ is also at the H level, causing the gate line $GL_n$ to be activated (brought into the selected state). Thereafter, when the clock signal CLK returns to the L level, the output signal $G_n$ also returns to the L level, causing the gate line $GL_n$ to return to the non-selected state.

After the output signal $G_n$ is transmitted to the unit shift register $SR_{n+1}$ of the immediately succeeding stage, the output signal $G_{n+1}$ therefrom, when raised to the H level, is input to the reset terminal RST to turn on the transistor Q4, causing the node N1 to drop to the L level. The transistor Q7 accordingly turns off, causing the node N2 to rise to the H level. That is, the unit shift register $SR_n$ returns to the reset state in which the transistor Q1 is off and the transistor Q2 is on.

As described, in the case of the gate-line driving circuit 30 configured as shown in FIG. 5, the operation of each of the unit shift registers SR is substantially the same as in a configuration as shown in FIG. 2 except that the reset terminal RST receives the output signal $G_{n+1}$ from the immediately succeeding stage.

The above-described operation is carried out in sequence by the plurality of unit shift registers $SR_1$, $SR_2$, . . . connected in cascade as shown in FIG. 5. Accordingly, the input signal (start pulse) input to the input terminal IN of the unit shift register $SR_1$ of the first stage is transmitted to the unit shift registers $SR_2$, $SR_3$, . . . in sequence while being shifted with timing synchronized with the clock signals CLK and /CLK. As a result, the gate-line driving circuit 30 can thereby drive the gate lines $GL_1$, $GL_2$, $GL_3$, . . . in sequence in synchronization with the clock signals CLK and /CLK as shown in the timing chart of FIG. 6.

Figure 6:
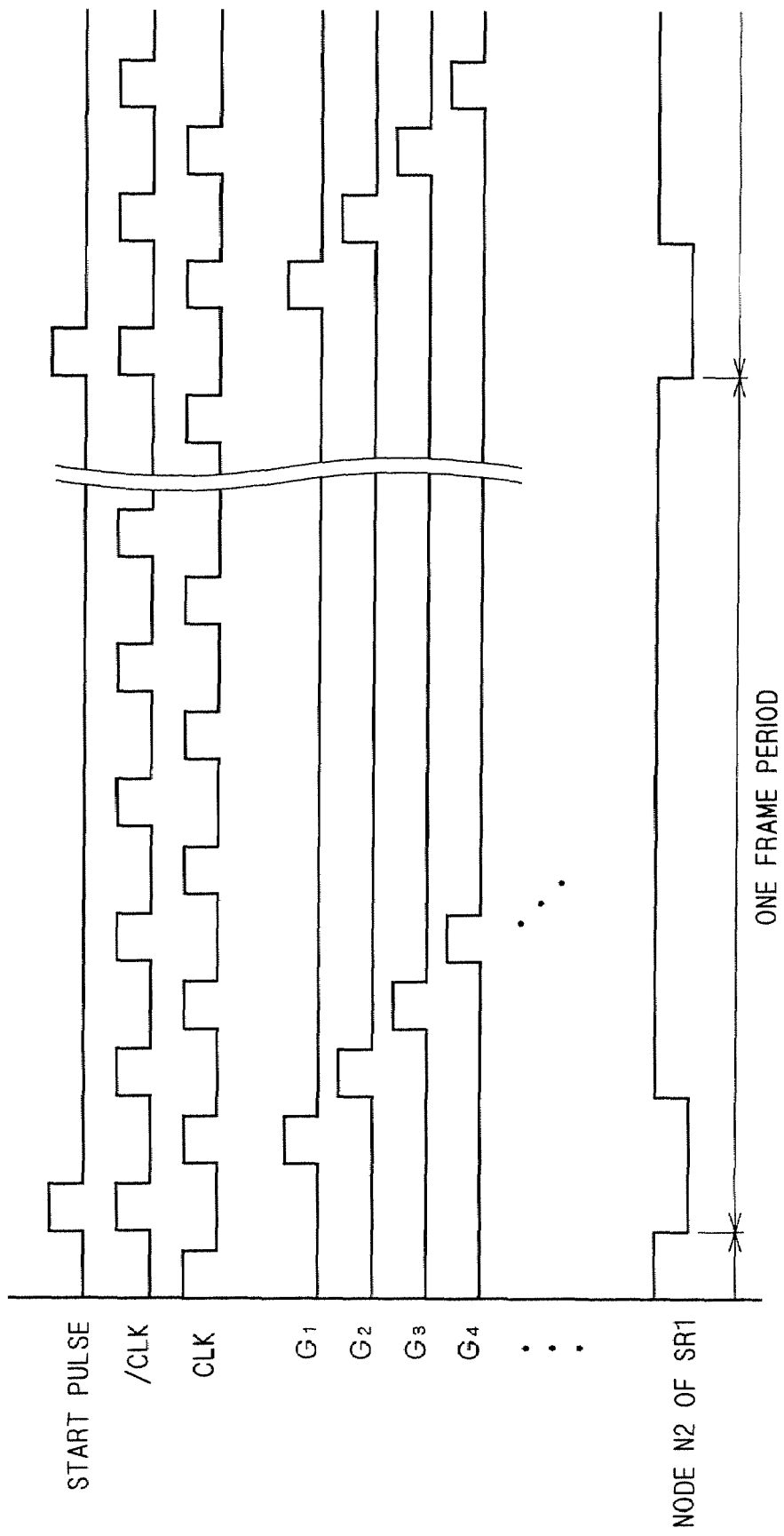
FIG. 6 is a timing chart of an operation of the gate-line driving circuit shown in FIG. 5.

In the configuration shown in FIG. 5, however, the reset terminal RST receives the output signal $G_{n+1}$ from the immediately succeeding stage. Accordingly, each of the unit shift registers SR returns to the reset state (i.e., the above-described initial state) only after a unit shift register SR of the immediately succeeding stage is operated at least once. Each of the unit shift registers SR cannot carry out the normal operation as shown in FIG. 6 unless it undergoes the reset state. Therefore, the configuration shown in FIG. 5 requires carrying out a dummy operation in which a dummy input signal is transmitted through the unit shift registers SR from the first to the last stages prior to the normal operation. Alternatively, a reset transistor may additionally be provided between the node N2 and third power terminal S3 (high supply voltage) of each of the unit shift registers SR to carry out a reset operation of compulsory charging the node N2 prior to the normal operation. In that case, however, the provision of a reset signal line is additionally required.

The aforementioned problem of malfunction of the conventional unit shift register SR will now be described in detail. In the following description, each transistor constituting the unit shift register SR is assumed to be an a-Si TFT.

The lowermost part of the timing chart of FIG. 6 shows voltage waveforms at the node N2 of the unit shift register $SR_1$ in the gate-line driving circuit 30 shown in FIG. 5. As described above, when a signal input to the input terminal IN (start pulse or output signal $G_{n-1}$ from the immediately preceding stage) rises to the H level, the node N2 drops to the L level, but immediately returns to the H level by a signal input to the reset terminal RST (output signal $G_{n+1}$ from the immediately succeeding stage) to be maintained at the H level for about one frame period (about 16 ms) (although not shown, this behavior is also seen in the case of FIG. 2). That is, the gate of each of the transistors Q2 and Q5 is continuously positively biased (dc-biased) for about one frame period, which is repeatedly carried out in each frame. Accordingly, when the unit shift register SR is formed of a-Si TFTs, the threshold voltage of the transistors Q2 and Q5 is shifted to the positive direction, resulting in degraded driving capability.

When the transistor Q5 in the reset state is degraded in driving capability, charges occurred at the node N1 due to the noise resulting from, for example, an overlap capacitance between the gate and source/drain of the transistor Q1, and the like cannot be discharged quickly, which may cause the node N1 to rise in level. In such case, the transistor Q1 in the off state decreases in resistance, causing charges to be unnecessarily supplied to the output terminal OUT when the clock signal CLK rises to the H level. Further, when the transistor Q2 has degraded driving capability at this time, charges at the output terminal OUT occurred by the noise cannot be discharged quickly, causing the output terminal OUT to rise in level. That is, a malfunction that the gate line which should be in the non-selected state is brought into the selected state occurs, resulting in a display malfunction of the liquid crystal display 10.

As described earlier, the aforementioned paper by S. Y. Yoon, et al. presents a gate driver circuit in which dual output pull-down transistors are provided for a unit shift register and are alternately activated/deactivated by each frame so that the gate electrode of one of the output pull-down transistors is not continuously biased. This can avoid the display malfunction. However, dual circuits (pull-down driving circuits) for driving the dual pull-down transistors need to be provided in the unit shift register, which raises a concern about resultant increased consumption power. Hereinafter, a shift register according to the present invention capable of solving the aforementioned malfunction will be described.

Figure 7:
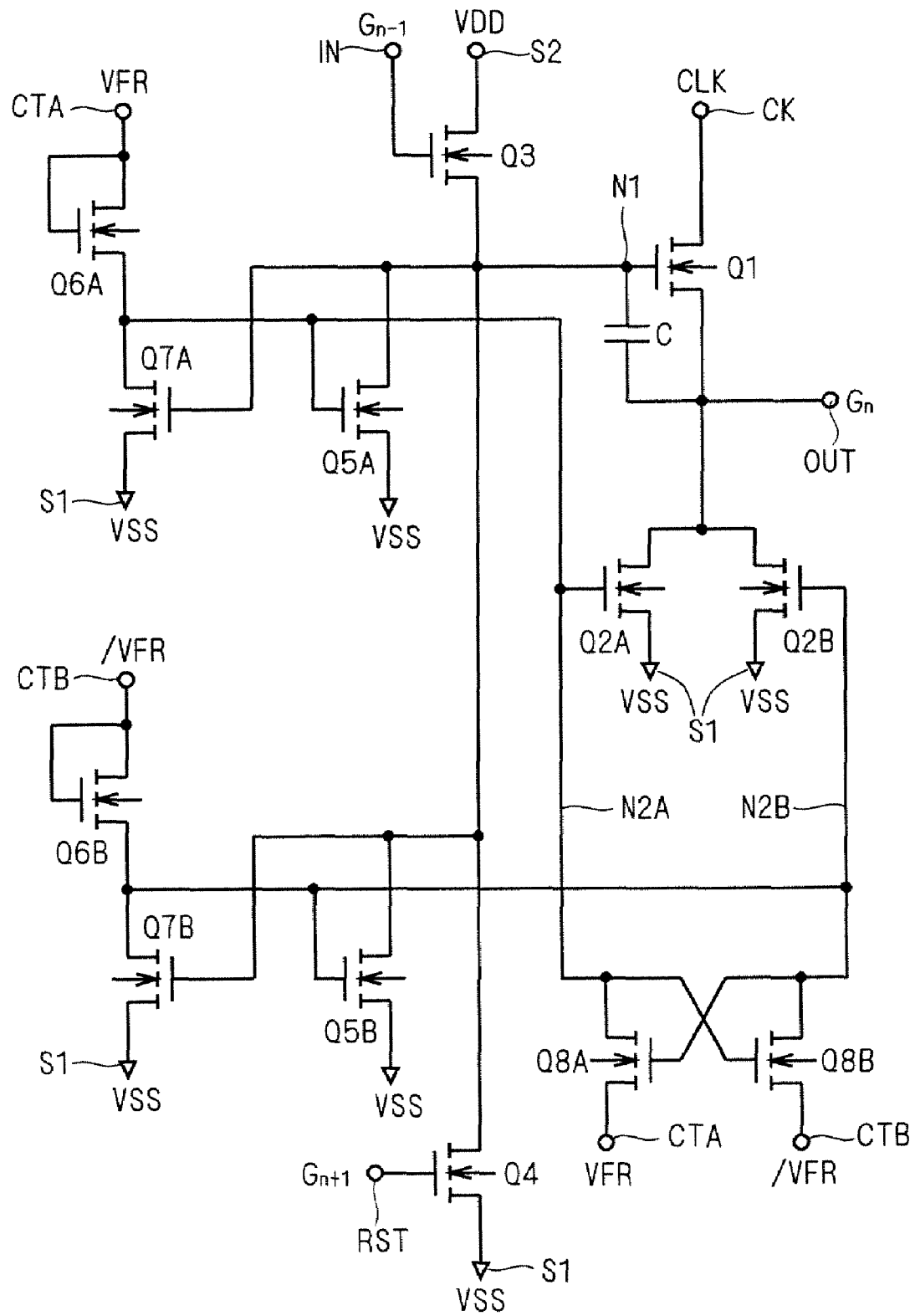
FIG. 7 is a circuit diagram illustrating the configuration of a unit shift register according to a first preferred embodiment of the invention.

FIG. 7 is a circuit diagram illustrating the configuration of the unit shift register SR according to the first preferred embodiment of the present invention. As shown in the drawing, the output stage of the unit shift register SR includes the transistor Q1 connected between the output terminal OUT and clock terminal CK and transistors Q2A and Q2B both connected between the output terminal OUT and first power terminal S1. More specifically, the transistor Q1 is a first transistor for supplying a clock signal input to the clock terminal CK to the output terminal OUT, and the transistors Q2A and Q2B are second and third transistors, respectively, for supplying the level at the first power terminal S1 to the output terminal OUT. As shown in FIG. 7, a node to which the gate (control electrode) of the transistor Q1 is defined as a node N1, a node to which the gate of the transistor Q2A is connected is defined as a node N2A, and a node to which the gate of the transistor Q2B is connected is defined as a node N2B.

The capacitive element C is provided between the gate and source of the transistor Q1, i.e., between the node N1 and output terminal OUT. The transistor Q3 is connected between the node N1 and second power terminal S2, and has its gate connected to the input terminal IN. Transistors Q4, Q5A and Q5B are connected between the node N1 and first power terminal S1. The transistor Q4 has its gate connected to the reset terminal RST. The transistor Q5A has its gate connected to the node N2A, and the transistor Q5B has its gate connected to the node N2B.

The unit shift register SR according to the present embodiment includes a first control terminal CTA to which a predetermined first control signal VFR is input and a second control terminal CTB to which a second control signal /VFR is input. The first control signal VFR and second control signal /VFR are complementary to each other, and are generated by a driver controller (not shown) for driving the gate-line driving circuit 30. Preferably, these first control signal VFR and second control signal /VFR are controlled to switch in level (i.e., alternate) during a blanking period between frames of a display image, and are controlled to switch in level by each frame of a display image, for example.

A transistor Q8A is connected between the first control terminal CTA and node N2A, and a transistor Q8B is connected between the second control terminal CTB and node N2B. The transistor Q8A has its gate connected to the drain of the transistor Q8B (node N2B), and the transistor Q8B has its gate connected to the drain of the transistor Q8A (node N2A). In other words, the transistors Q8A and Q8B constitute what is called a flip-flop circuit each having one main electrode (drain in this embodiment) connected to the control electrode (gate) of each other in a crossed manner.

A diode-connected transistor Q6A is connected between the node N2A and first control terminal CTA. A transistor Q7A having its gate connected to the node N1 is connected between the node N2A and first power terminal S1. These transistors Q6A and Q7A constitute a ratio inverter in which the node N1 serves as an input node and the node N2A serves as an output node; however, unlike a typical inverter, the first control signal VFR is supplied as power supply.

A diode-connected transistor Q6B is connected between the node N2B and second control terminal CTB. A transistor Q7B having its gate connected to the node N1 is connected between the node N2B and first power terminal S1. These transistors Q6B and Q7B constitute a ratio inverter in which the node NI serves as an input node and the node N2B serves as an output node; however, unlike a typical inverter, the second control signal /VFR is supplied as power supply. Hereinafter, the inverter formed of the transistors Q6A and Q7A will be called "a first inverter", and the inverter formed of the transistors Q6B and Q7B will be called "a second inverter".

FIG. 8 is a timing chart illustrating the operation of the unit shift register SR according to the first preferred embodiment. Hereinafter, the unit shift register SR according to the present embodiment shown in FIG. 7 will be described with reference to FIG. 8. While the unit shift register SR shown in FIG. 7 is applicable to either configuration of the gate-line driving circuits 30 shown in FIGS. 2 and 5, the following description is addressed to the operation of the gate-line driving circuit 30 formed of cascade-connected unit shift registers SR as shown in FIG. 5. The first control signal VFR and second control signal /VFR are input to all cascade-connected unit shift registers SR.

The operation of the unit shift register $SR_n$ of the n-th stage will be discussed as a representative example. It is assumed that the clock terminal CK of the unit shift register $SR_n$ receives the clock signal CLK. An output signal from the unit shift register $SR_n$ is defined as $G_n$, and output signals from the unit shift register $SR_{n-1}$ of the immediately preceding (n−1)th stage and the unit shift register $SR_{n+1}$ of the immediately succeeding (n+1)th stage are defined as $G_{n-1}$ and $G_{n+1}$, respectively.

For ease of description, the H level of each the clock signals CLK and /CLK, first control signal VFR and second control signal /VFR is all assumed to be equal to the high supply voltage VDD. The first control signal VFR and second control signal /VFR are assumed to be controlled to switch in level by each frame of a display image. Further, Threshold voltages of transistors constituting the unit shift register SR are all assumed to have the same value, Vth.

As shown in FIG. 8, the first control signal VFR rises to the H level and the second control signal /VFR drops to the L level at time t1 in the blanking period (not shown) between frame periods. Since the first control signal VFR is input to the first control terminal CTA of the unit shift register $SR_n$, the drain and gate of the transistor Q6A rises from VSS to VDD, causing the transistor Q6A to turn on. In other words, power is supplied to the first inverter formed of the transistors Q6A and Q7A, so that the first inverter is activated. Since the transistor Q5B is on, and the node N1 is at the L level (i.e., non-selected state of the gate line $GL_n$) at this time, the transistor Q7A is off, causing the node N2A to rise in level.

Figure 9A:
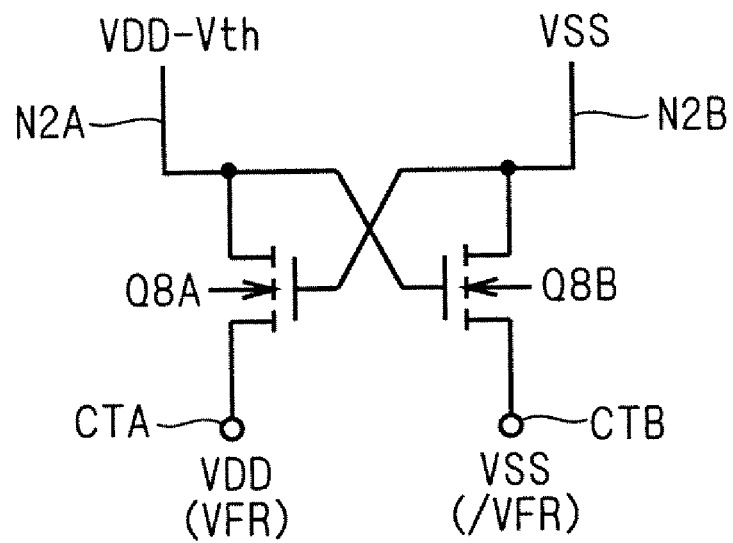
FIGS. 9A and 9B are diagrams for explaining the operation of the unit shift register according to the first preferred embodiment.

Since the second control signal /VFR is input to the second control terminal CTB, the drain and gate of the transistor Q6B drops from VDD to VSS. In other words, power is not supplied to the second inverter formed of the transistors Q6B and Q7B. As the transistor Q6B serves as a diode in which the direction from the second control terminal CTB to the node N2B is the forward direction, charges at the node N2B are not discharged through the transistor Q6B. As described above, however, since the node N2A rises in level and the source of the transistor Q8B (second control terminal CTB) is at VSS, the transistor Q8B is turned on, causing the node N2B to drop to the L level (VSS). The transistor Q8A is accordingly turned off, causing the node N2A to rise to the H level (VDD-Vth). That is, the potential distribution in the flip-flop circuit formed of the transistors Q8A and Q8B is as shown in FIG. 9A after time t1.

Since the second inverter is not activated during a period in which the first control signal VFR is at the H level and the second control signal /VFR is at the L level, the node N2B is fixed to the L level. Therefore, the transistors Q2B and Q5B are not biased at the gate, and thus are deactivated during that period. In other words, in the unit shift register SR during that period, a combination of the transistors Q1, Q2A, Q3, Q4, Q5A, Q6A and Q7A constitutes a circuit equivalent to the unit shift register SR shown in FIG. 3, and is capable of performing a similar operation.

That is, the output signal $G_{n-1}$ from the immediately preceding stage, when raised to the H level at time t2, is input to the input terminal IN, causing the transistor Q3 to turn on. At this time, the transistor Q5A also turns on, however, the node N1 rises to the H level (VDD-Vth) since the transistor Q3 is defined as having an on-state resistance sufficiently lower than that of the transistor Q5A.

In the first inverter formed of the transistors Q6A and Q7A, the node N1 serves as an input node, and the node N2A serves as an output node. Thus, when the node N1 rises to the H level, the node N2A drops to the L level. The transistors Q2A and Q5A are accordingly turned off. Here, since the first inverter is a ratio inverter, the potential of output at the L level is a value determined by the ratio between on-state resistances of the transistors Q6A and Q7A. That is, the transistors Q6A and Q7A are both turned on during a period in which the node N2A is at the L level, causing a short circuit current to flow from the first control terminal CTA to the first power terminal S1 through the transistors Q6A and Q7A, whereby a certain amount of power is consumed.

Thereafter, when the output signal $G_{n-1}$ from the immediately preceding stage returns to the L level, the transistor Q3 is turned off, but the node N1 is brought into a floating state, so that the node N1 is maintained at the H level. Then, when the clock signal CLK rises to the H level at time t3, the clock signal CLK at the H level is supplied to the output terminal OUT since the transistor Q1 is on, causing the output signal $G_n$ to rise to the H level. At this time, the node N1 is stepped up by a certain voltage by the capacitive coupling between the capacitive element C and gate-channel capacitance of the transistor Q1, along with the rise in level of the output signal $G_n$. Accordingly, the source-gate voltage of the transistor Q1 is maintained high, so that the transistor Q1 is maintained at a low impedance. Therefore, the output signal $G_n$ quickly follows the level of the clock signal CLK. The output signal $G_n$ thus quickly returns to the L level when the clock signal CLK returns to the L level.

When the output signal $G_{n+1}$ from the immediately succeeding stage rises to the H level at time t4, it is input to the reset terminal RST, turning the transistor Q4 on. As a result, the node N1 drops to the L level, turning the transistor Q7A off, which causes the node N2A to return to the H level (VDD-Vth). Thereafter, this state is maintained until the first control signal VFR and second control signal /VFR are inverted in level at time t5 in the next blanking period.

Then, when the first control signal VFR drops to the L level, and the second control signal /VFR rises to the H level at time t5, the second inverter formed of the transistors Q6B and Q7B is activated contrary to what is was, causing the node N2B to rise to the H level. The transistor Q8A is accordingly turned on, and the first inverter is not activated since the drain of the transistor Q6A (first control terminal CTA) is at VSS, causing the node N2A to drop to the L level (VSS).

Figure 9B:
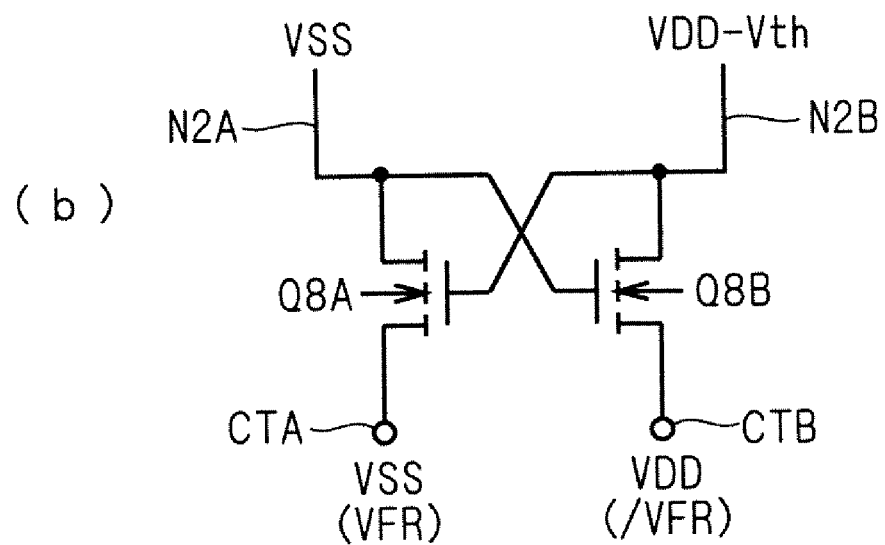

That is, the potential distribution in the flip-flop circuit formed of the transistors Q8A and Q8B is as shown in FIG. 9B after time t5. During that period, the transistors Q2A and Q5A are not biased at the gate, and thus are deactivated. Further, the first inverter does not operate with no power being supplied. Therefore, in the unit shift register SR, a combination of the transistors Q1, Q2B, Q3, Q4, Q5B, Q6B and Q7B constitutes a circuit equivalent to the unit shift register SR shown in FIG. 3, whereby similar operations to those at time t1 to t5 are performed.

As described, the unit shift register SR shown in FIG. 7 is capable of performing similar operations as in the conventional shift register shown in FIG. 3. In addition, the pair of the transistors Q2A and Q5A and the pair of the transistors Q2B and Q5B are alternately deactivated every time the first control signal VFR and second control signal /VFR are inverted, which prevents the gates of those transistors from being dc-biased. This can prevent the unit shift register SR from malfunctioning due to shifts in threshold voltage of a-Si TFTs, which achieves improved operational reliability.

In the unit shift register SR according to the present embodiment including the first inverter formed of the transistors Q6A and Q7A and the second inverter formed of the transistors Q6B and Q7B, the first and second inverters are alternately activated every time the first control signal VFR and second control signal /VFR complementary to each other are inverted. In other words, the first and second inverters serve as a driving circuit for alternately driving the transistors Q2A and Q2B on the basis of the first control signal VFR and second control signal /VFR. Since both the first and second inverters are not activated at the same time, consumption power is equivalent to that of a shift register including a single inverter, which prevents increase in consumption power.

In the unit shift register SR according to the present embodiment, the transistors Q8A and Q8B constitute a flip-flop circuit, however, unlike a typical flip-flop circuit, the first control signal VFR and second control signal /VFR are input to the sources of the transistors Q8A and Q8B, respectively. For instance, at time t2, the transistor Q8B needs to be turned on by the output from the inverter formed of the transistors Q7A and Q8A, but the source of the transistor Q8A (first control signal VFR) is at VDD at that time. Accordingly, even when a small current flows from the inverter formed of the transistors Q6A and Q7A, the node N2A sufficiently rises in level to turn on the transistor Q8B, which prevents increase in consumption power.

Assuming that the source potential of the transistors Q8A and Q8B to be fixed to VSS as in the typical flip-flop circuit, the transistor Q6A needs to have sufficiently greater driving capability than the transistor Q8A in order to cause the node N2A to sufficiently rise in level, resulting in increased consumption power. Further, since the operation of a ratio inverter is defined by the ratio between the on-state resistances of two transistors, increasing the transistor Q6A in driving capability requires the transistor Q7A to be also increased in driving capability, which causes consumption power of the inverter to be increased. The unit shift register shown in FIG. 7 also solves this problem.

Another advantage given by inputting the first control signal VFR and second control signal /VFR to the sources of the transistors Q8A and Q8B, respectively, is as follows: during a period in which the first control signal VFR is at the H level and the second control signal /VFR is at the L level, the potential distribution in the transistors Q8A and Q8B is as shown in FIG. 9A except a selected period in which the gate line GL is selected, whereby the gate of the transistor Q8A is negatively biased with respect to the source. Conversely, during a period in which the first control signal VFR is at the L level and the second control signal /VFR is at the H level, the potential distribution in the transistors Q8A and Q8B is as shown in FIG. 9B except the selected period in which the gate line GL is selected, whereby the gate of the transistor Q8B is negatively biased with respect to the source.

As described above, the gates of the transistors Q8A and Q8B are negatively biased with respect to the sources at regular intervals, which effectively prevents the threshold voltage of the transistors Q8A and Q8B from being shifted in the positive direction. This can suppress degradation in driving capability of the transistors Q8A and Q8B, so that the L level potential (VSS) with low impedance can be supplied to the nodes N2A and N2B. This in result achieves a great advantage in preventing the threshold voltage of the transistors Q2A, Q2B, Q5A and Q5B from being shifted.

While it has been described above that the first control signal VFR and second control signal /VFR are switched in level (i.e., alternate) in a blanking period by each frame, the cycle may be arbitrarily determined. For instance, the switching may be carried out every two or more frames. However, too long cycle may cause the threshold voltages of the transistors Q2A, Q2B, Q5A and Q5B to be shifted significantly, so that the effects of the present invention may not be obtained sufficiently. Therefore, it is preferable that the switching be made about every frame as described in the present embodiment. The timing of alteration may not necessarily be within a blanking period, however, switching during operation of the unit shift register SR may cause voltage variations in the circuit, which may result in a malfunction such as delay in operating speed caused by a parasitic capacitance, and the like. Accordingly, it is preferable that the switching be made in a blanking period as in the above example.

Second Preferred Embodiment

In the unit shift register SR according to the first preferred embodiment, the transistor Q6A constituting the first inverter and the transistor Q6B constituting the second inverter are both diode-connected. In other words, the transistor Q6A has its gate and drain both connected to the first control terminal CTA to which the first control signal VFR is input, and the transistor Q6B has its gate and drain both connected to the second control terminal CTB to which the second control signal /VFR is input.

Figure 10:
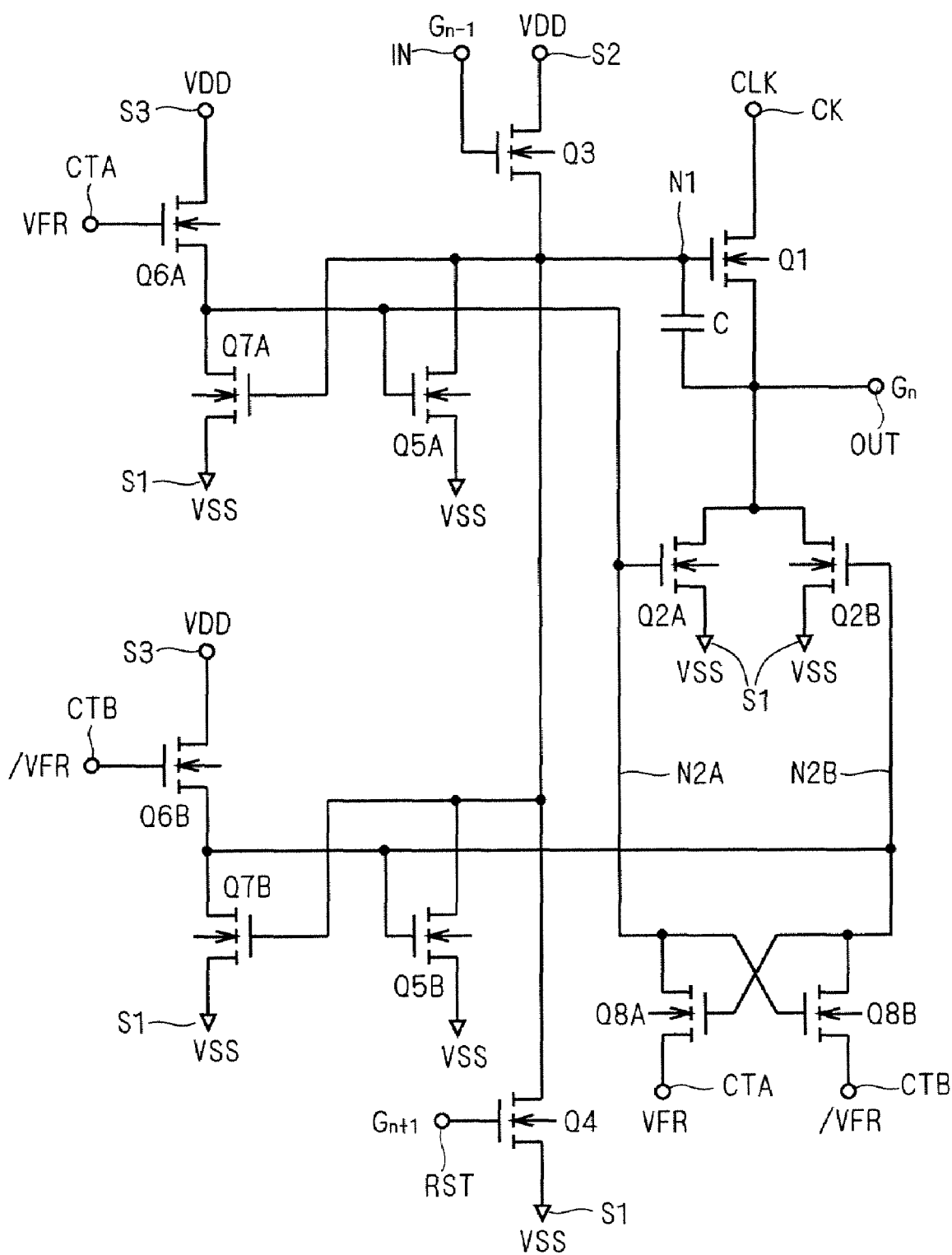
FIG. 10 is a circuit diagram illustrating the configuration of a unit shift register according to a second preferred embodiment of the invention.

FIG. 10 is a circuit diagram illustrating the configuration of a unit shift register SR according to a second preferred embodiment. As shown in the drawing, the transistor Q6A has its gate connected to the first control terminal CTA, but its drain connected to the third power terminal S3 to which the high supply voltage VDD is input. Similarly, the transistor Q6B has its gate connected to the second control terminal CTB, but its drain connected to the third power terminal S3.

More specifically, according to the present embodiment, the first inverter is formed of the transistor Q6A connected between the node N2A and third power terminal S3, with its gate receiving the first control signal VFR and the transistor Q7A connected between the node N2A and first power terminal S1, with its gate connected to the node N1. The second inverter is formed of the transistor Q6B connected between the node N2B and third power terminal S3, with its gate receiving the second control signal /VFR and the transistor Q7B connected between the node N2B and first power terminal S1, with its gate connected to the node N1.

The unit shift register SR according to the present embodiment differs from the unit shift register SR according to the first preferred embodiment (FIG. 7) in that the high supply voltage VDD is supplied to the drains of the transistors Q6A and Q6B, but almost the same in operation. Therefore, the present embodiment achieves similar effects as those in the first preferred embodiment.

With the configuration shown in FIG. 10, the load capacity of the first control signal VFR and second control signal /VFR is smaller than in the configuration shown in FIG. 3, which is advantageous in that consumption power is further reduced.

Third Preferred Embodiment

Figure 11:
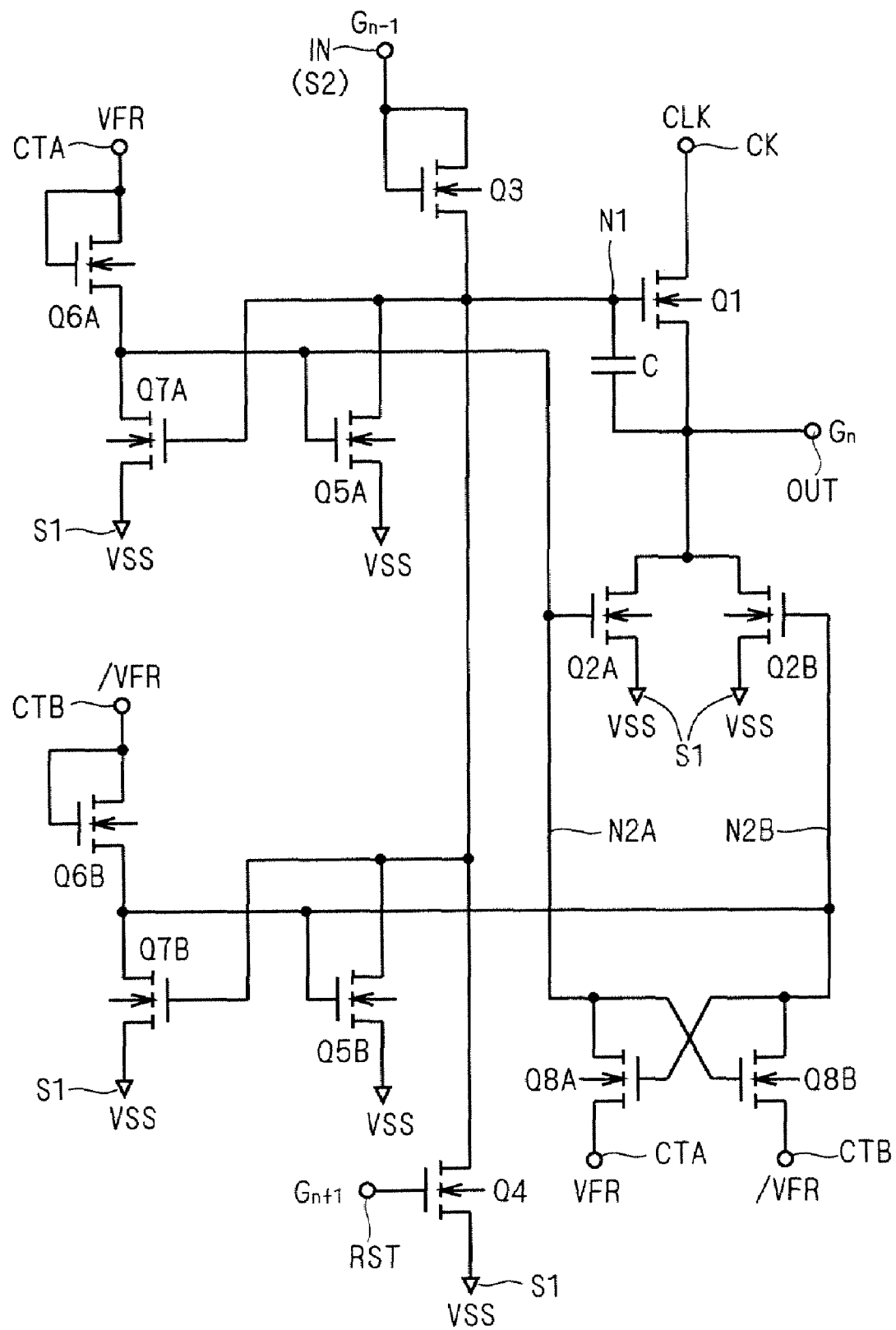
FIG. 11 is a circuit diagram illustrating the configuration of a unit shift register according to a third preferred embodiment of the invention.

FIG. 11 is a circuit diagram illustrating the configuration of a unit shift register SR according to a third preferred embodiment. According to the present embodiment, the transistor Q3 has its drain connected to the input terminal IN, not to the power source. This can reduce the area occupied by a wire for power supply. However, it should be noted that the input terminal IN is connected to the output terminal OUT of the immediately preceding stage, which increases a load on the output stage of each unit shift register SR, so that the speed of circuit operation may be reduced.

While FIG. 11 shows an example of the present embodiment applied to the circuit according to the first preferred embodiment (FIG. 7), the present embodiment may also be applied to the circuit according to the second preferred embodiment (FIG. 10).

Fourth Preferred Embodiment

A field effect transistor including TFT is a device which conducts by electric connection between the drain and source made by a conductive channel formed directly under a gate electrode with a gate insulation film interposed therebetween within a semiconductor substrate when a voltage not less than a threshold voltage is applied to the gate electrode. Accordingly, a field effect transistor in the conducting state has a certain static capacitance (gate capacitance) between the gate and channel, that is, the field effect transistor may also function as a capacitive element with its channel and gate electrode within the semiconductor substrate serving as both electrodes and the gate insulation film serving as a dielectric layer. Such capacitive element is called "a MOS (Metal-Oxide Semiconductor) capacitive element".

Figure 12:
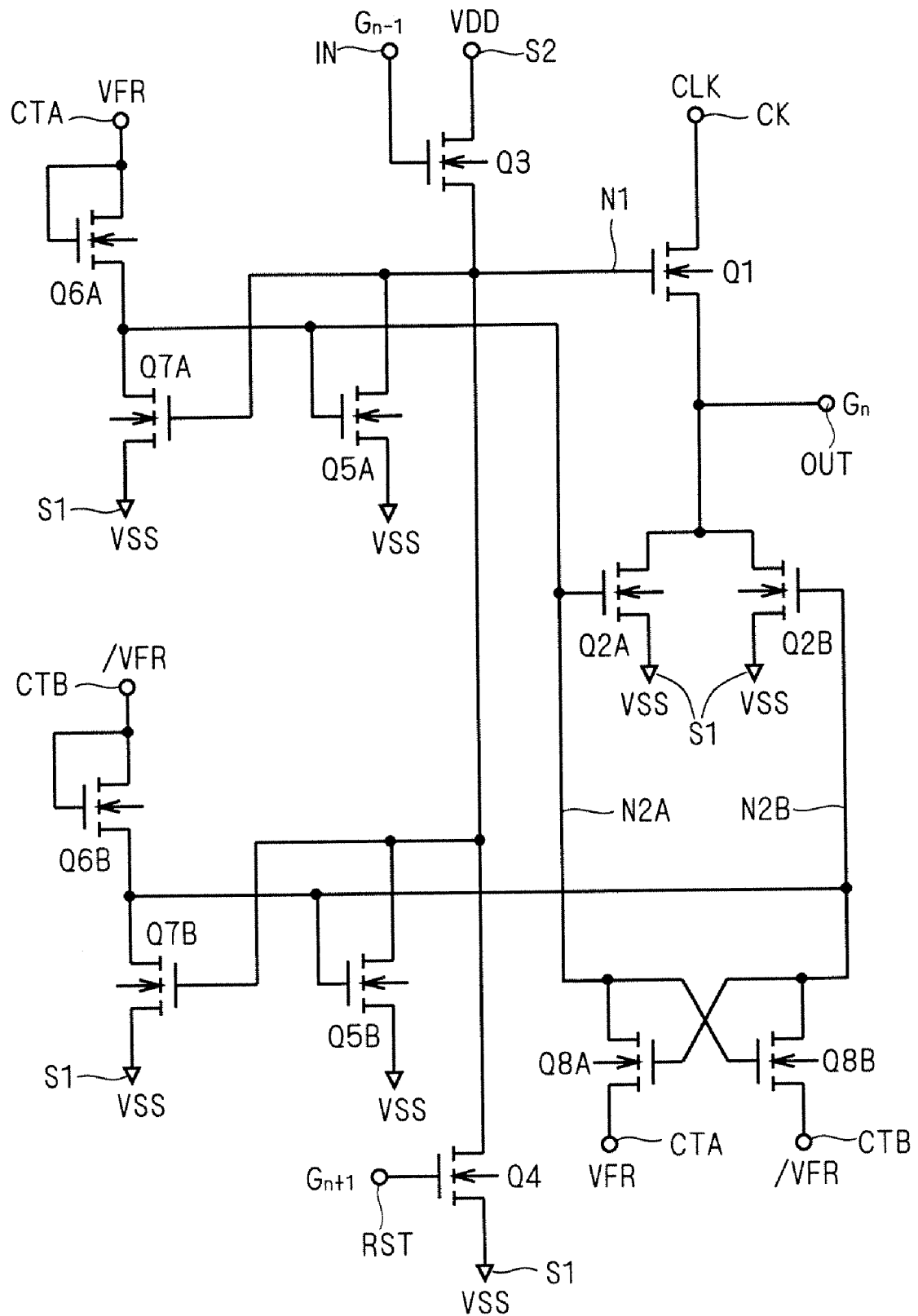
FIG. 12 is a circuit diagram illustrating the configuration of a unit shift register according to a fourth preferred embodiment of the invention.

FIG. 12 is a circuit diagram illustrating the configuration of a unit shift register SR according to a fourth preferred embodiment. While the capacitive element C is provided between the drain and source of the transistor Q1 in the above-described preferred embodiments for efficiently stepping up the node N1, it is replaced by the gate capacitance of the transistor Q1 in the present embodiment. In this case, the capacitive element C is not required, as shown in the circuit diagram of FIG. 12.

The insulation film to be a dielectric layer of a capacitive element formed in a semiconductor integrated circuit generally has the same thickness as a gate insulation film of a transistor. Accordingly, when replacing a capacitive element by a gate capacitance of a transistor, a transistor having the same area as the capacitive element may be used. Specifically, increasing the gate width of the transistor Q1 as necessary in FIG. 12 achieves an operation similar to that performed by the above-described preferred embodiments. Further, increasing the gate width of the transistor Q1 increases its driving capability, resulting in increased rising and falling rates of the output signal, which produces another advantageous effect of achieving higher speed operation.

While FIG. 12 shows the example of the present embodiment applied to the circuit according to the first preferred embodiment (FIG. 7), the present embodiment may also be applied to the circuits according to the second and third preferred embodiments (FIGS. 10, 11) and the like.

Fifth Preferred Embodiment

Figure 13:
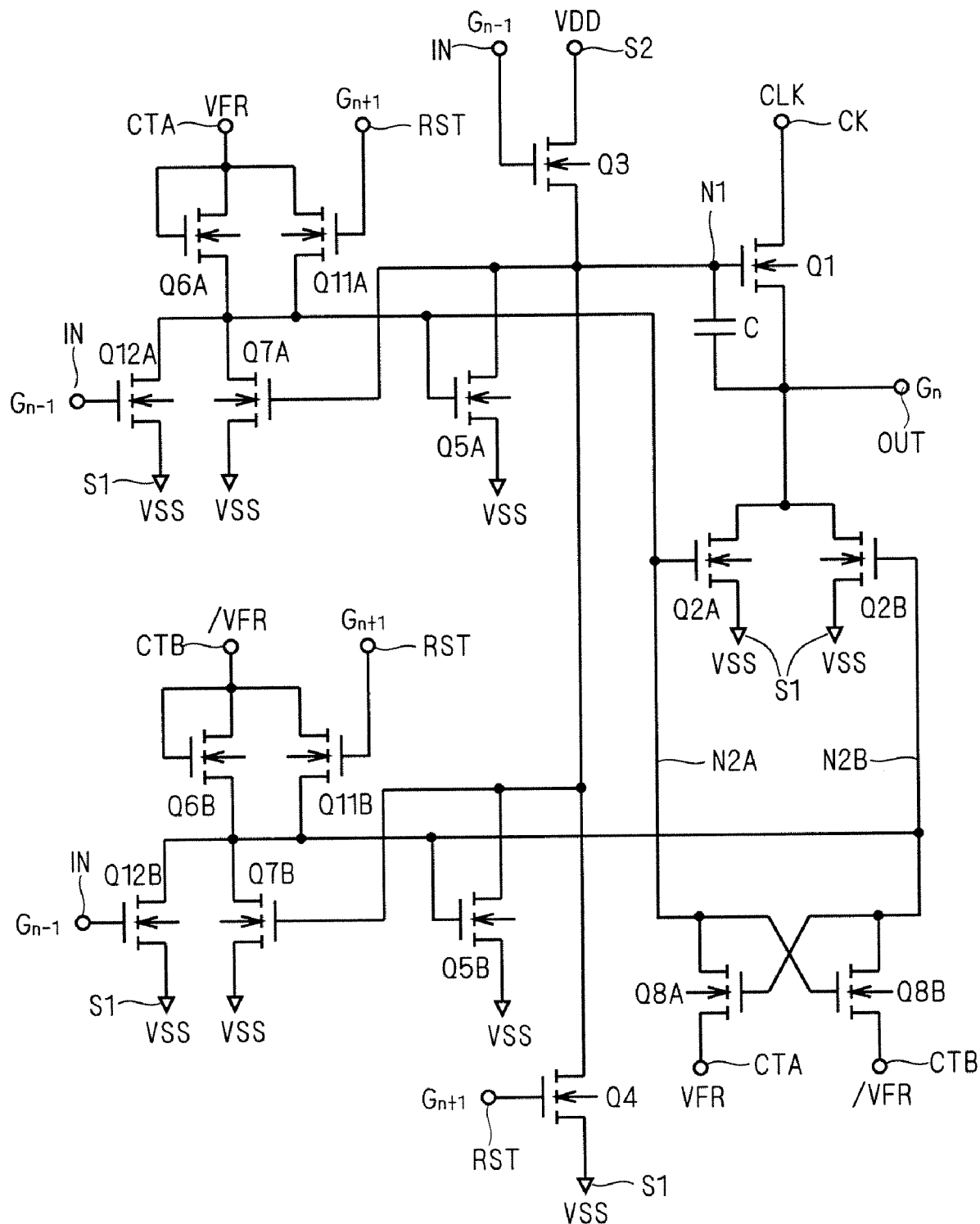
FIGS. 13 and 14 are circuit diagrams each illustrating the configuration of a unit shift register according to a fifth preferred embodiment of the invention.

The present embodiment presents a configuration for speeding up the operation of the unit shift registers SR according to the above-described preferred embodiments. FIG. 13 is a circuit diagram illustrating the configuration of a unit shift register SR according to a fifth preferred embodiment. As shown in the drawing, a transistor Q11A having its gate connected to the reset terminal RST is provided between the node N2A and first control terminal CTA (in parallel to the transistor Q6A), and a transistor Q12A having its gate connected to the input terminal IN is provided between the node N2A and first power terminal S1 (in parallel to the transistor Q7A). Further, a transistor Q11B having its gate connected to the reset terminal RST is provided between the node N2B and second control terminal CTB (in parallel to the transistor Q6B), and a transistor Q12B having its gate connected to the input terminal IN is provided between the node N2B and first power terminal S1 (in parallel to the transistor Q7B). The configuration of the present embodiment is similar to that of the first preferred embodiment (FIG. 7) except these transistors.

For instance, it is assumed that the first control signal VFR is at the H level and the second control signal /VFR is at the L level. In this case, when the output signal $G_{n-1}$ from the immediately preceding stage rises to the H level, the transistor Q12A is turned on, causing the node N2A serving as the output node of the first inverter to drop to the L level at high speeds. The transistor Q5A is accordingly turned off, causing the node N1 to rise to the H level at high speeds. When the output signal $G_{n+1}$ from the immediately succeeding stage rises to the H level, the transistor Q11A is turned on, causing the node N2A to rise to the H level at high speeds. The transistor Q5A is accordingly turned on, causing the node N1 to drop to the L level at high speeds.

As described, the nodes N1 and N2A are shifted in level at high speeds by the action of the transistors Q11A and Q12A. Similarly, the transistors Q11B and Q12B speed up level shift at the nodes N1 and N2B. Therefore, the present embodiment achieves a higher speed operation than in the first preferred embodiment.

Figure 14:
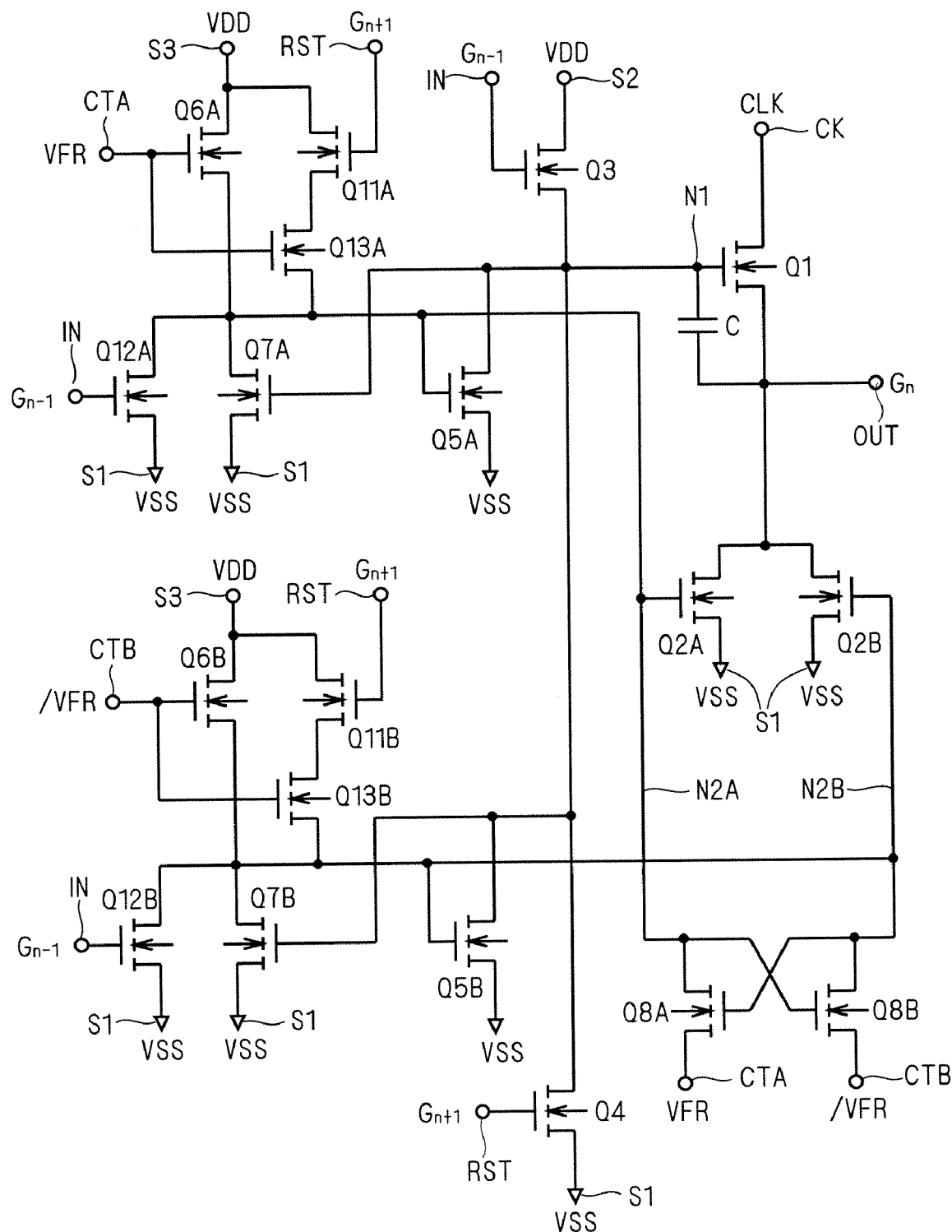

The above-described technique is applicable to the unit shift register SR according to the second preferred embodiment (FIG. 10). In that case, as shown in FIG. 14, transistors Q11A and Q13A connected in series are provided between the node N1 and third power terminal S3 (in parallel to the transistor Q6A). The transistor Q11A has its gate connected to the reset terminal RST, and the transistor Q13A has its gate connected to the first control terminal CTA. Similarly, transistors Q11B and Q13B connected in series is provided between the node N1 and third power terminal S3 (in parallel to the transistor Q6B). The transistor Q11B has its gate connected to the reset terminal RST, and the transistor Q13B has its gate connected to the second control terminal CTB.

Similarly to the case of FIG. 13, the nodes N1 and N2A are shifted in level at high speeds by the action of the transistors Q11A, Q12A and Q13A. Similarly, the transistors Q11B, Q12B and Q13B speed up level shift at the nodes N1 and N2B. Therefore, the present embodiment achieves a higher speed operation than in the first preferred embodiment. The transistor Q13A prevents the node N2A to be maintained at the L level during a period in which the first control signal VFR is at the L level from being charged by the transistor Q11A. Similarly, the transistor Q13B prevents the node N2B to be maintained at the L level during a period in which the second control signal /VFR is at the L level from being charged by the transistor Q11B.

In the present embodiment, as the transistors Q11A, Q12A, Q13A, Q11B, Q12B and Q13B increase in driving capability, the effect of high speed operation increases. Since a short circuit current dose not flow through the transistors Q11A, Q12A, Q11B and Q12B, consumption power is increased only slightly by increasing the gate width. Therefore, a high speed operation can be achieved while preventing increase in consumption power.

The third and fourth preferred embodiments are also applicable to the present embodiment.

Sixth Preferred Embodiment

Figure 15:
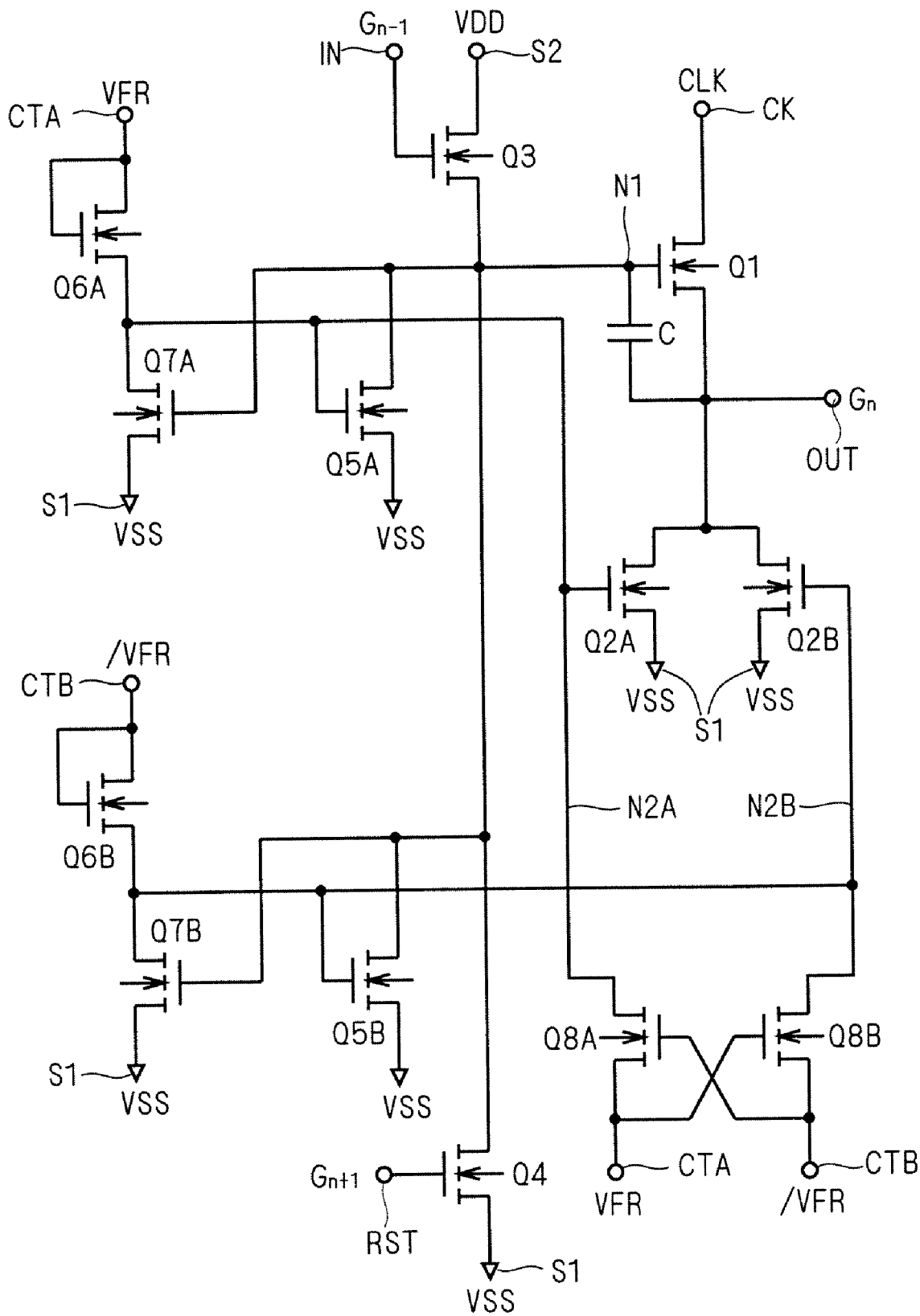
FIG. 15 is a circuit diagram illustrating the configuration of a unit shift register according to a sixth preferred embodiment of the invention.

FIG. 15 is a circuit diagram illustrating the configuration of a unit shift register SR according to a sixth preferred embodiment. According to the present embodiment, main electrodes of the transistors Q8A and Q8B connected to each other are sources, unlike in the first preferred embodiment. In other words, while the circuit shown in FIG. 7 turns on/off the transistors Q8A and Q8B by outputs of the first and second inverters, respectively, the turning on/off is carried out by the first and second control signals VFR and /VFR, respectively, in the present embodiment. The circuit is similar in operation to the circuit shown in FIG. 7 except this point. Therefore, the present embodiment achieves similar effects as those in the first preferred embodiment.

Figure 16A:
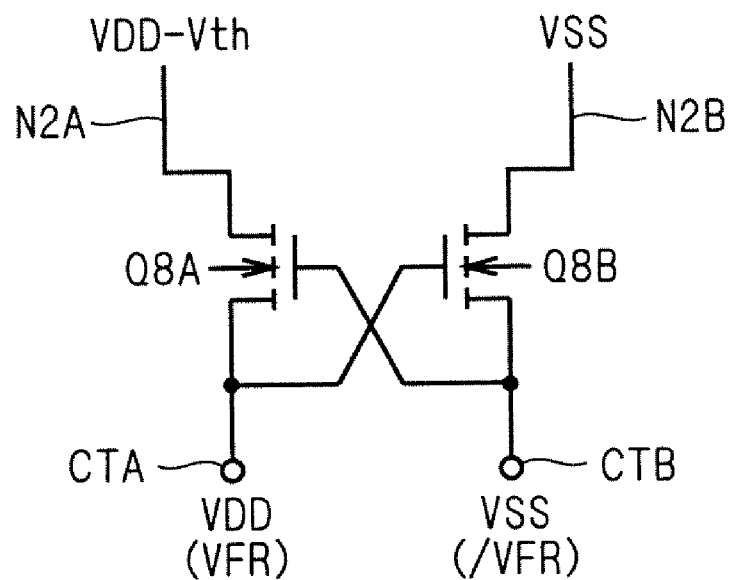
FIGS. 16A and 16B are diagrams for explaining the operation of the unit shift register according to the sixth preferred embodiment.
Figure 16B:
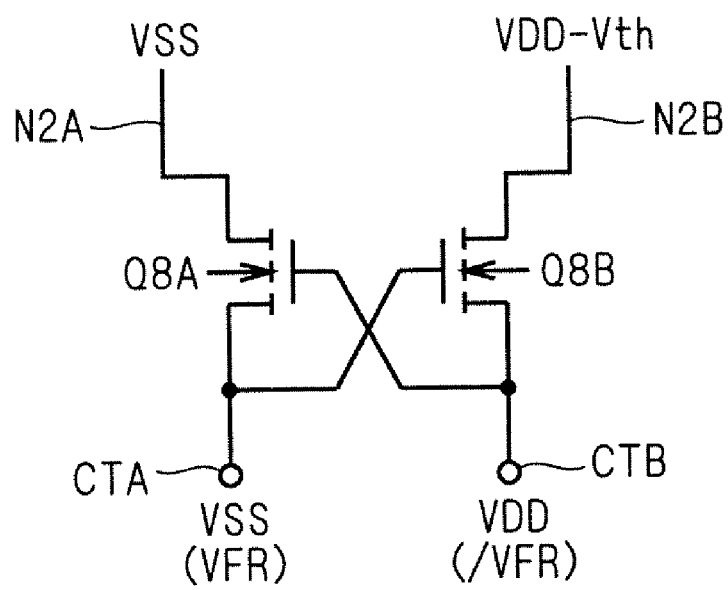

In the unit shift register SR shown in FIG. 15, during a period in which the first control signal VFR is at the H level and the second control signal /VFR is at the L level, the potential distribution in the transistors Q8A and Q8B is as shown in FIG. 16A except the selected period in which the gate line GL is selected, whereby the gate of the transistor Q8A is negatively biased with respect to the source. Conversely, during a period in which the first control signal VFR is at the L level and the second control signal /VFR is at the H level, the potential distribution in the transistors Q8A and Q8B is as shown in FIG. 16B except the selected period in which the gate line GL is selected, whereby the gate of the transistor Q8B is negatively biased with respect to the source.

According to the present embodiment, as described above, the gates of the transistors Q8A and Q8B are also negatively biased with respect to the sources at regular intervals, which effectively prevents the threshold voltage of the transistors Q8A and Q8B from being shifted in the positive direction. This can suppress degradation in driving capability of the transistors Q8A and Q8B, so that the L level potential (VSS) of low impedance can be supplied to the nodes N2A and N2B. This in result achieves a great advantage in preventing the threshold voltage of the transistors Q2A, Q2B, Q5A and Q5B from being shifted.

The aforementioned third to fifth preferred embodiments may also be applied to the present embodiment.

Seventh Preferred Embodiment

While the alternate driving of the transistors Q2A and Q2B is performed by the two inverters in the above preferred embodiments, a similar operation is carried out by a single inverter in the present embodiment.

Figure 17:
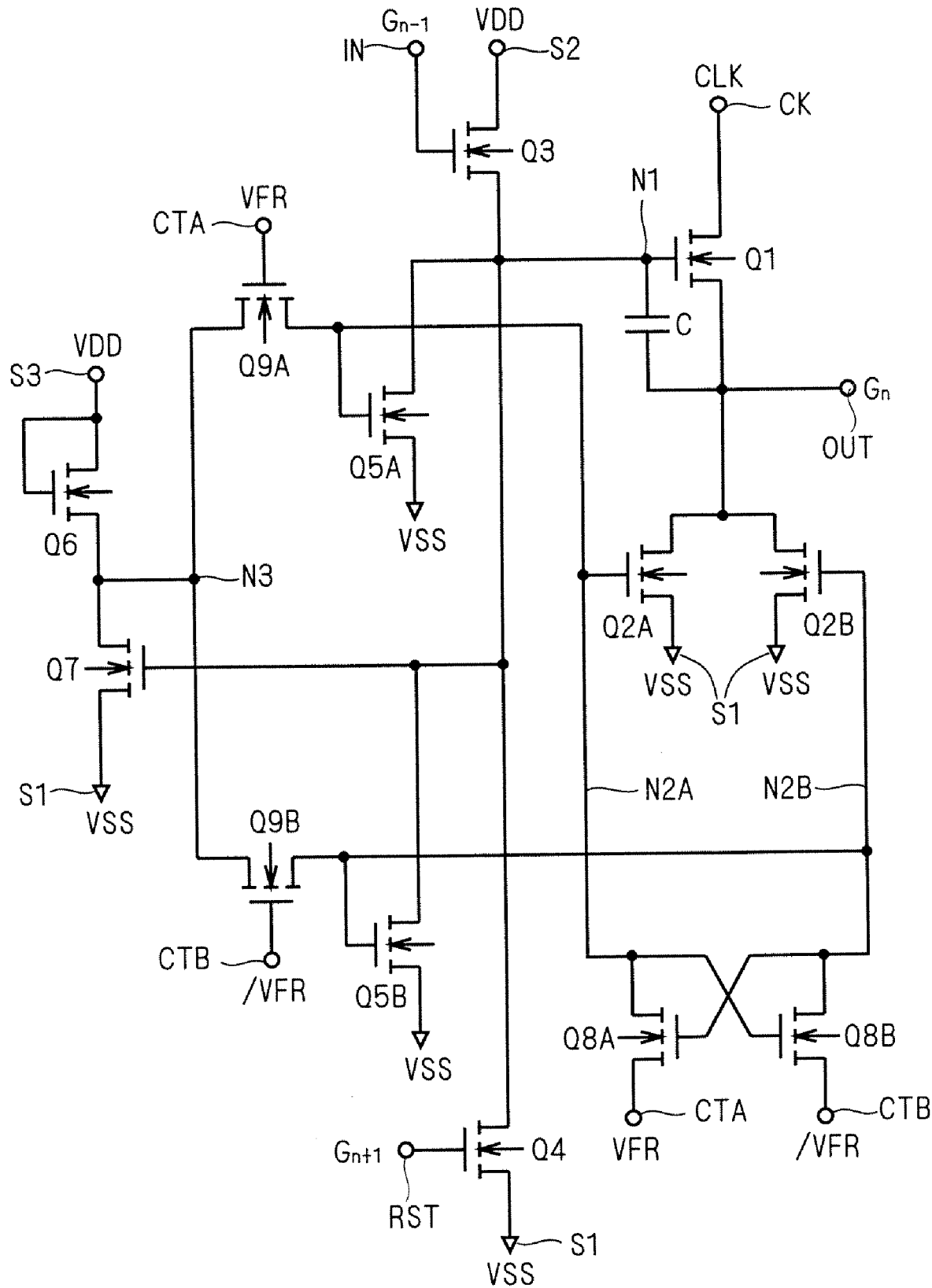
FIGS. 17 and 18 are circuit diagrams each illustrating the configuration of a unit shift register according to a seventh preferred embodiment of the invention.

FIG. 17 is a circuit diagram illustrating the configuration of a unit shift register SR according to a seventh preferred embodiment. In the unit shift register SR, the driving circuit for driving the transistors Q2A and Q2B includes an inverter formed of the transistors Q6 and Q7, the transistor Q9A connected between the output node of that inverter (defined as a node N3) and node N2A and the transistor Q9B connected between the nodes N3 and N2B. The transistor Q9A has its gate connected to the first control terminal CTA to which the first control signal VFR is input, and the transistor Q9B has its gate connected to the second control terminal CTB to which the second control signal /VFR is input. In the inverter, the transistor Q6 is diode-connected and is connected between the node N3 and third power terminal S3, and the transistor Q7 having its gate connected to the node N1 is connected between the node N3 and first power terminal SI.

In the present embodiment, during a period in which the first control signal VFR is at the H level and the second control signal /VFR is at the L level, the transistor Q9A is turned on and the transistor Q9B is turned off, causing the output node of the inverter, i.e., the node N3 to be electrically connected to the node N2A. In other words, during that period, the transistor Q2A is activated while the transistor Q2B is deactivated. Conversely, in a period in which the first control signal VFR is at the L level and the second control signal /VFR is at the H level, the transistor Q9A is turned off and the transistor Q9B is turned on, causing the node N3 to be electrically connected to the node N2B. In other words, during that period, the transistor Q2B is activated while the transistor Q2A is deactivated. In this manner, the transistors Q9A and Q9B serve as a switching circuit for connecting the output node (node N3) of the inverter formed of the transistors Q6 and Q7 alternately to the nodes N2A and N2B.

In the present embodiment, the pair of the transistors Q2A and Q5A and the pair of the transistors Q2B and Q5B are alternately deactivated every time the first control signal VFR and second control signal /VFR are inverted, which prevents the gates of those transistors from being dc-biased. This can prevent a malfunction due to shifts in threshold voltage of a-Si TFTs, which achieves improved operational reliability. In addition, since the circuit of the present embodiment drives the transistors Q2A and Q2B using a single inverter, increase in consumption power is suppressed.

Further, the number of transistors whose gates are connected to the node N1 is smaller than, for example, in the first preferred embodiment, which reduces the gate capacitance of transistors connected to the node N1. Thus, the parasitic capacitance at the node N1 is reduced, increasing the step-up amount at the node N1 by the clock terminal CK, which results in higher driving capability of the transistor Q1 when the output signal $G_n$ is output. This produces an advantage of higher speed operation.

Figure 18:
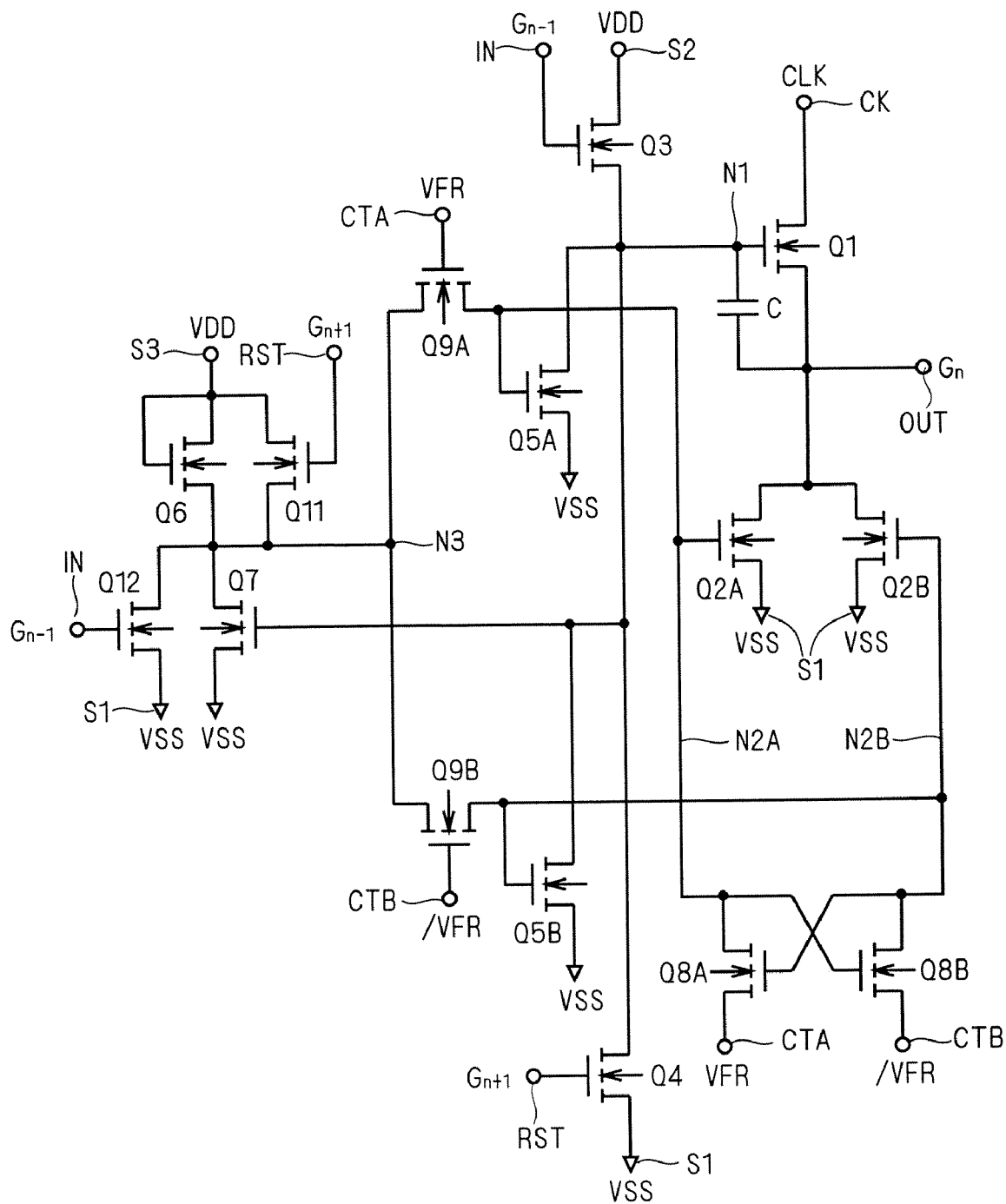

Furthermore, the fifth preferred embodiment may be applied to the inverter formed of the transistors Q6 and Q7. FIG. 18 shows the circuit diagram in that case. As shown, a transistor Q11 having its gate connected to the reset terminal RST is provided between the node N3 and third power terminal S3 (in parallel to the transistor Q6), and a transistor Q12 having its gate connected to the input terminal IN is provided between the node N3 and first power terminal S1 (in parallel to the transistor Q7). This allows still higher speed operation.

It should be noted that not only the fifth preferred embodiment but also the third, fourth and sixth preferred embodiments are applicable to the present embodiment.

Eighth Preferred Embodiment

In the circuit according to the first preferred embodiment (FIG. 7), when the output terminal OUT (output signal $G_n$) rises to the H level, the transistors Q7A and Q7B are both on since the node N1 is at the H level. Thus, the nodes N2A and N2B are both at the L level with low impedance. In contrast, in the circuit according to the seventh preferred embodiment (FIG. 17), when the first control signal VFR is at the H level and the second control signal /VFR is at the L level, for instance, the node N2B is at the L level with high impedance. When the output signal Gn rises from the L level to the H level in that state, the node N2B rises in level by a coupling through a gate-to-drain overlap capacitance of the transistor Q2B. Then, the transistor Q2B may conduct to cause the output signal $G_n$ at the H level to disadvantageously drop.

FIG. 19 is a circuit diagram illustrating the configuration of a unit shift register SR according to an eighth preferred embodiment. As shown, the unit shift register SR according to the present embodiment further includes, in the circuit according to the seventh preferred embodiment (FIG. 17), a transistor Q10A connected between the node N2A and first power terminal S1 and a transistor Q10B connected between the node N2B and second power terminal S2. The transistors Q10A and Q10B have their gates both connected to the output terminal OUT.

In the unit shift register SR according to the present embodiment, the transistors Q10A and Q10B are both on during a period in which the output signal $G_n$ is at the H level, allowing the nodes N2A and N2B to be at the L level with low impedance. Thus, the transistors Q2A and Q2B can be maintained in the off state without fail during that period, which can solve the aforementioned problem.

Figure 20:
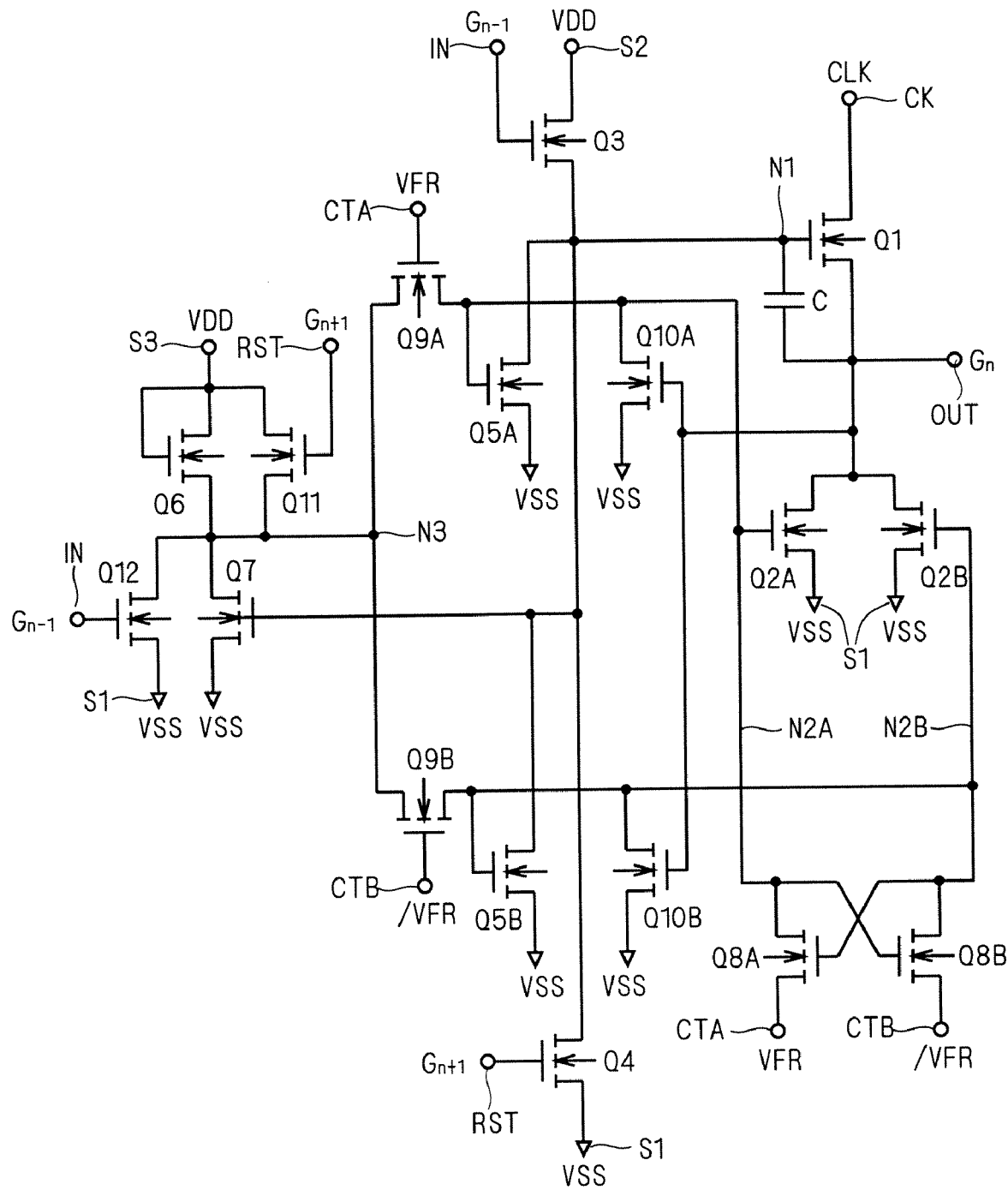

FIG. 19 shows the configuration in which the transistors Q10A and Q10B are provided for the circuit shown in FIG. 17, however, as shown in FIG. 20, these transistors may be provided for the circuit shown in FIG. 18. This can produce an advantage of achieving higher speed operation of the unit shift register SR as in the circuit shown in FIG. 18.

Further, the third, fourth and sixth preferred embodiments may also be applied to the present embodiment.

While the invention has been shown and described in detail, the foregoing description is in all aspects illustrative and not restrictive. It is therefore understood that numerous modifications and variations can be devised without departing from the scope of the invention.

What is claimed is:

1. A shift register comprising:
   a clock terminal and an output terminal;
   a first transistor configured to supply a clock signal input to said clock, terminal to said output terminal; and
   second and third transistors both configured to discharge said output terminal, wherein
   said first, second and third transistors have their control electrodes connected to first, second and third nodes, respectively,
   said shift register further comprising:
   a fourth transistor connected between a first control terminal to which a predetermined first control signal is input and said second node;
   a fifth transistor connected between a second control terminal to which a predetermined second control signal is input and said third node; and
   a driving circuit configured to alternately drive said second and third transistors on the basis of said first and second control signals, wherein said fourth and fifth transistors each have one main electrode connected to a control electrode of each other in a crossed manner.

2. The shift register according to claim 1, wherein said driving circuit includes:
a first inverter in which said first node serves as an input node and said second node serves as an output node; and
a second inverter in which said first node serves as an input node and said third node serves as an output node, wherein
said first and second inverters are alternately activated on the basis of said first and second control signals.

3. The shift register according to claim 2, wherein said first inverter includes:
a diode-connected sixth transistor connected between said second node and said first control terminal; and
a seventh transistor connected between said second node and said first power terminal, said seventh transistor having a control electrode connected to said first node, and
said second inverter includes:
a diode-connected eighth transistor connected between said third node and said second power terminal; and
a ninth transistor connected between said third node and said first power terminal, said ninth transistor having a control electrode connected to said first node.

4. The shift register according to claim 2, wherein said first inverter includes:
a sixth transistor connected between said second node and said second control terminal, said sixth transistor having a control electrode to which said first control signal is input; and
a seventh transistor connected between said second node and said first power terminal, said seventh transistor having a control electrode connected to said first node, and
said second inverter includes:
an eighth transistor connected between said third node and said second power terminal, said eighth transistor having a control electrode to which said second control signal is input; and
a ninth transistor connected between said third node and said first power terminal, said ninth transistor having a control electrode connected to said first node.

5. The shift register according to claim 1, wherein said driving circuit includes:
an inverter in which said first node serves as an input node; and
a switching circuit configured to electrically connect an output node of said inverter alternately to said second and third nodes.

6. The shift register according to claim 5, wherein said switching circuit includes:
a sixth transistor connected between the output node of said inverter and said second node, said sixth transistor having a control electrode to which said first control signal is input; and
a seventh transistor connected between the output node of said inverter and said third node, said seventh transistor having a control electrode to which said second control signal is input.

7. The shift register according to claim 1, further comprising a capacitive element connected between said first node and said output terminal.

8. The shift register according to claim 1, wherein said first and second control signals are complementary to each other.

9. A shift register comprising a plurality of shift registers connected in cascade, each being defined in claim 1.

10. An image display apparatus comprising a gate-line driving circuit formed of a plurality of shift registers connected in cascade, wherein
each of said plurality of shift registers includes: a clock terminal and an output terminal;
a first transistor configured to supply a clock signal input to said clock terminal to said output terminal; and
second and third transistors both configured to discharge said output terminal, said first, second and third transistors have their control electrodes connected to first, second and third nodes, respectively,
said shift register further includes:
a fourth transistor connected between a first control terminal to which a predetermined first control signal is input and said second node;
a fifth transistor connected between a second control terminal to which a predetermined second control signal is input and said third node; and
a driving circuit configured to alternately drive said second and third transistors on the basis of said first and second control signals, and
said fourth and fifth transistors each have one main electrode connected to a control electrode of each other in a crossed manner.

11. The image display apparatus according to claim 10, wherein
said first and second control signals are controlled to be switched in level in a blanking period between frames of a display image.

12. The image display apparatus according to claim 11, wherein
said first and second control signals are controlled to be switched in level by each frame of a display image.

13. A shift register comprising:
a clock terminal and an output terminal;
a first transistor configured to supply a clock signal input to said clock terminal to said output terminal; and
second and third transistors both configured to discharge said output terminal, wherein
said first, second and third transistors have their control electrodes connected to first, second and third nodes, respectively,
said shift register further comprising:
a driving circuit configured to alternately drive said second and third transistors on the basis of predetermined first and second control signals,
a circuit configured to keep said third transistor off while said driving circuit drives said second transistor, and
a circuit configured to keep said second transistor off while said driving circuit drives said third transistor,
said driving circuit including:
a circuit configured to generate a signal for driving said second and third transistors,
a switching circuit configured to supply the signal for driving said second and third transistors alternately to said second and third nodes wherein
the circuit configured to keep said second transistor off is a fourth transistor connected between a first control terminal to which said first control signal is input and said second node, and
the circuit configured to keep said third transistor off is a fifth transistor connected between a second control terminal to which said second control signal is input and said third node said fourth and fifth transistors each having one main electrode connected to a control electrode of each other in a crossed manner.

14. The shift register according to claim 13, wherein in said driving circuit,
the circuit configured to generate the signal for driving said second and third transistors is an inverter in which said first node serves as an input node, and
said switching circuit is configured to electrically connect an output node of said inverter alternately to said second and third nodes on the basis of said first and second control signals.

15. An image display apparatus comprising a gate-line driving circuit formed of a plurality of shift registers connected in cascade, wherein
each of said plurality of shift registers includes:
a clock terminal and an output terminal;
a first transistor configured to supply a clock signal input to said clock terminal to said output terminal; and
second and third transistors both configured to discharge said output terminal, said first, second and third transistors having their control electrodes connected to first, second and third nodes, respectively, and
said each of said plurality of shift registers further includes:
a driving circuit configured to alternately drive said second and third transistors on the basis of predetermined first and second control signals,
a circuit configured to keep said third transistor off while said driving circuit drives said second transistor, and
a circuit configured to keep said second transistor off while said driving circuit drives said third transistor,
said driving circuit including:
a circuit configured to generate a signal for driving said second and third transistors,
a switching circuit configured to supply the signal for driving said second and third transistors alternately to said second and third nodes, and
wherein said first and second control signals are controlled to be switched in level in a blanking period between frames of a display image.

16. The image display apparatus according to claim 15, wherein
said first and second control signals are controlled to be switched in level by each frame of a display image.

* * * * *